(12) United States Patent
Illek

(10) Patent No.: US 9,209,372 B2
(45) Date of Patent: Dec. 8, 2015

(54) OPTOELECTRONIC MODULE AND METHOD FOR PRODUCING AN OPTOELECTRONIC MODULE

(71) Applicant: OSRAM Opto Semiconductors GmbH, Regensburg (DE)

(72) Inventor: Stefan Illek, Donaustauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/404,428

(22) PCT Filed: May 15, 2013

(86) PCT No.: PCT/EP2013/060053
§ 371 (c)(1),
(2) Date: Nov. 26, 2014

(87) PCT Pub. No.: WO2013/178469
PCT Pub. Date: Dec. 5, 2013

(65) Prior Publication Data
US 2015/0108511 A1   Apr. 23, 2015

(30) Foreign Application Priority Data
Jun. 1, 2012   (DE) .......................... 10 2012 209 325

(51) Int. Cl.
*H01L 33/62* (2010.01)
*H01L 33/58* (2010.01)
*H01L 33/64* (2010.01)

(52) U.S. Cl.
CPC ................ *H01L 33/62* (2013.01); *H01L 33/58* (2013.01); *H01L 33/64* (2013.01); *H01L 2924/0002* (2013.01); *H01L 2933/0033* (2013.01); *H01L 2933/0066* (2013.01); *H01L 2933/0075* (2013.01); *H01L 2933/0091* (2013.01)

(58) Field of Classification Search
CPC ........................................................ H01L 33/62
USPC ............................................................ 257/88
See application file for complete search history.

(56) References Cited

U.S. PATENT DOCUMENTS

| 7,217,956 | B2 | 5/2007 | Daniels et al. |
| 8,314,441 | B2 | 11/2012 | Ruhnau et al. |
| 8,461,601 | B2 | 6/2013 | Herrmann |

(Continued)

FOREIGN PATENT DOCUMENTS

| DE | 10229067 A1 | 1/2004 |
| DE | 102007030129 A1 | 1/2009 |

(Continued)

*Primary Examiner* — Anthony Ho
(74) *Attorney, Agent, or Firm* — Slater & Matsil, L.L.P.

(57) ABSTRACT

An optoelectronic module has at least one semiconductor chip for emitting electromagnetic radiation. The semiconductor chip has a layer having a first conductivity, a layer having a second conductivity, a radiation surface and a contact surface which lies opposite the radiation surface. A contact is attached to the radiation surface. A frame made of a potting compound laterally encloses the semiconductor chip in at least some regions such that the radiation surface and the contact surface are substantially free of the potting compound. A first contact structure is arranged in at least some regions on the frame and in at least some regions on the contact surface. A second contact structure is arranged in at least some regions on the frame and in at least some regions on the contact of the radiation surface.

13 Claims, 25 Drawing Sheets

(56) References Cited

U.S. PATENT DOCUMENTS

| | | |
|---|---|---|
| 8,552,459 B2 | 10/2013 | Herrmann et al. |
| 8,835,937 B2 | 9/2014 | Wirth et al. |
| 2007/0290217 A1 | 12/2007 | Daniels |
| 2009/0127573 A1 | 5/2009 | Guenther et al. |
| 2013/0043496 A1 | 2/2013 | Sabathil et al. |
| 2013/0113010 A1 | 5/2013 | Brunner et al. |
| 2014/0034983 A1 | 2/2014 | Gebuhr et al. |

FOREIGN PATENT DOCUMENTS

| | | |
|---|---|---|
| DE | 102008057350 A1 | 5/2010 |
| DE | 102009022966 A1 | 12/2010 |
| DE | 102010028407 A1 | 11/2011 |
| DE | 102010031732 A1 | 1/2012 |
| DE | 102011011139 A1 | 8/2012 |
| WO | 2005081319 A1 | 9/2005 |

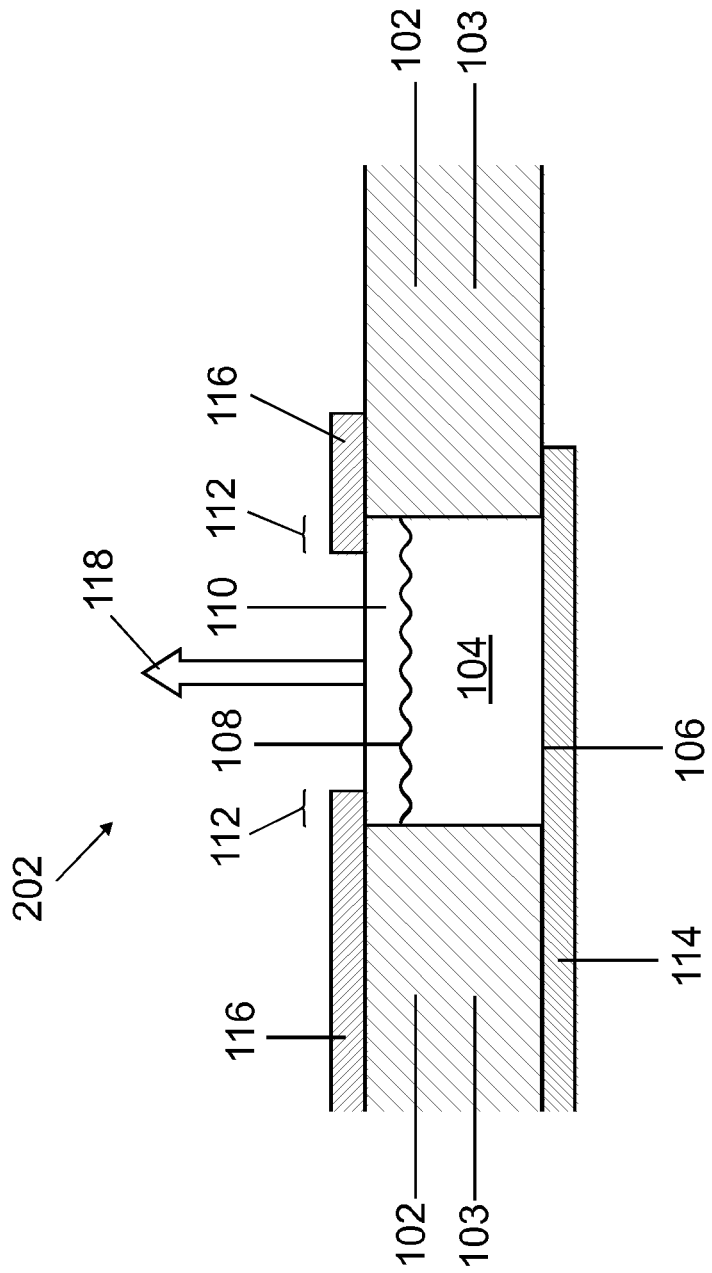

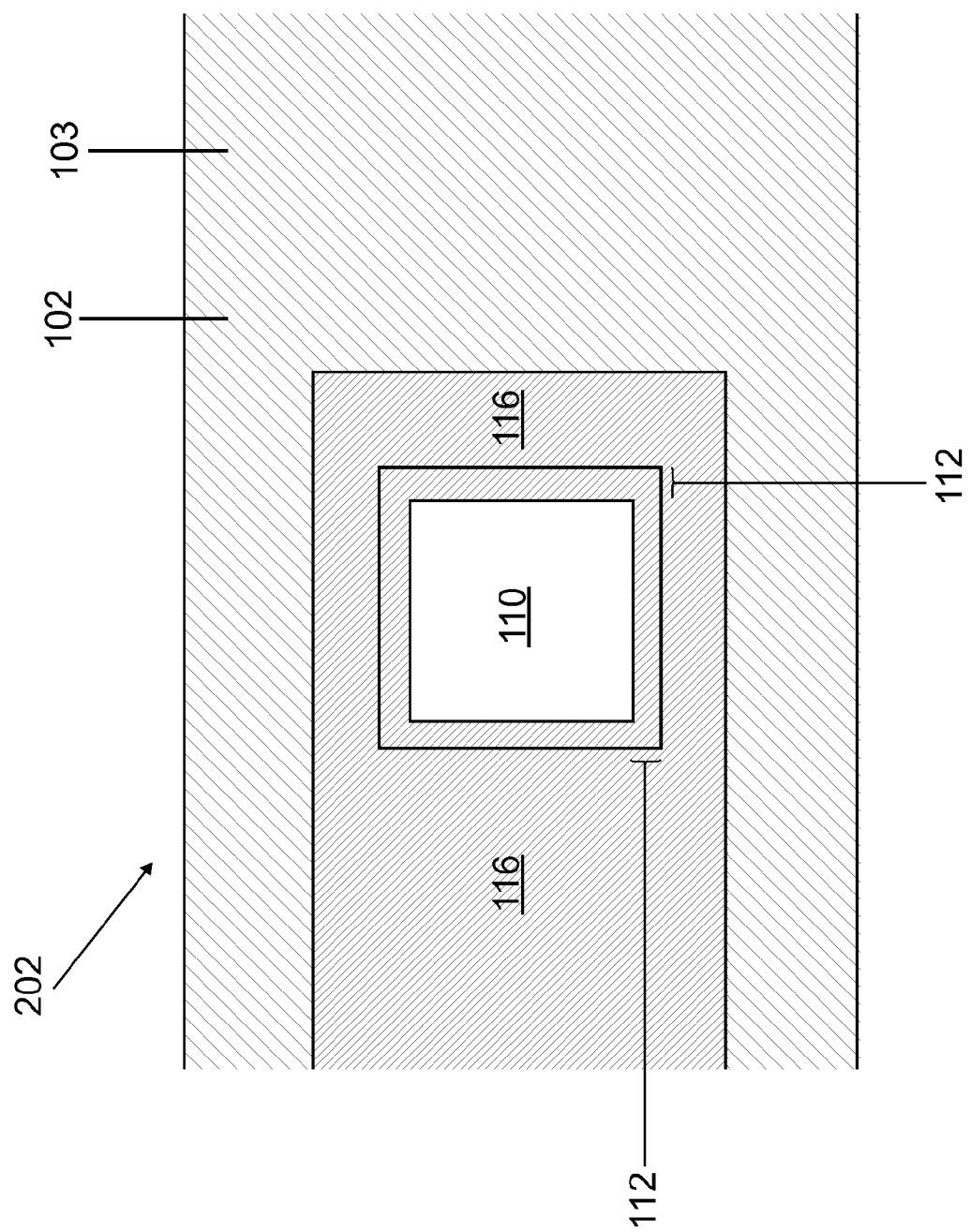

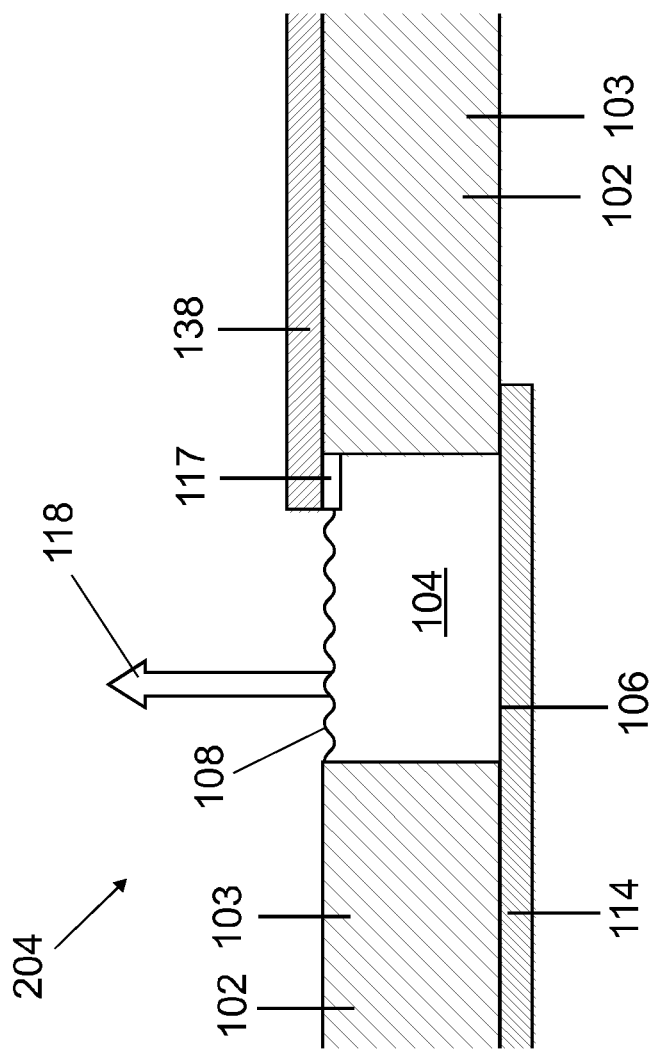

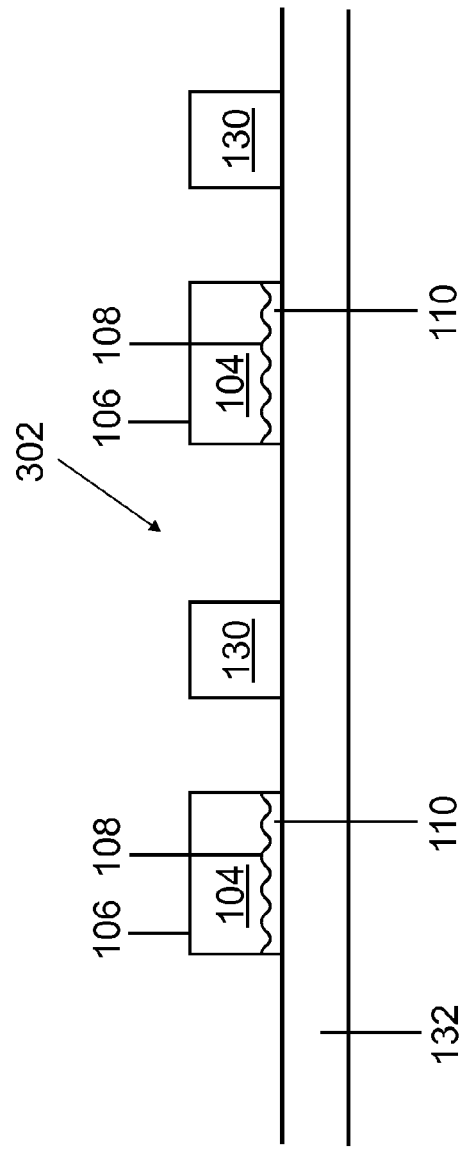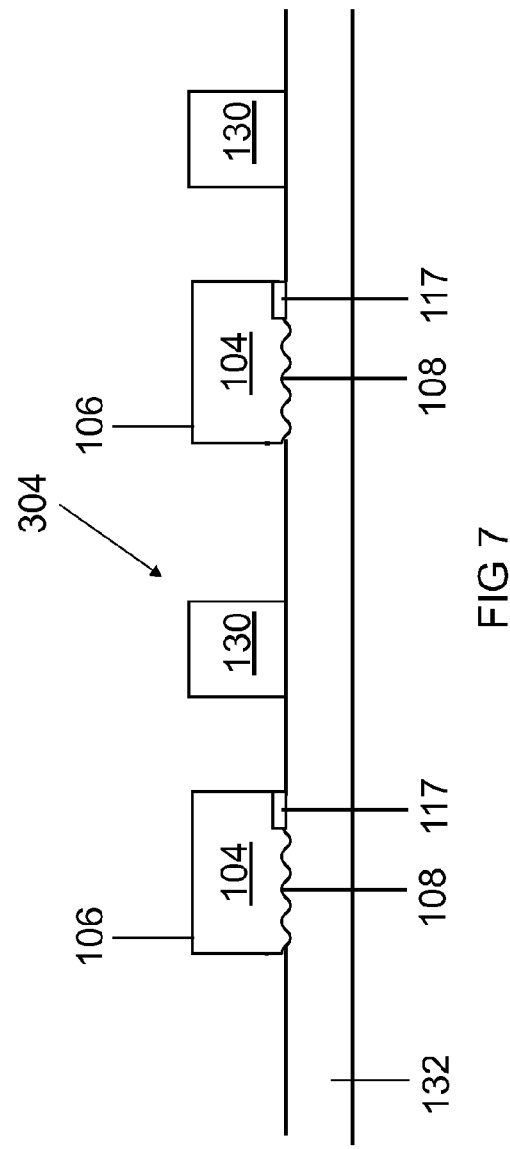

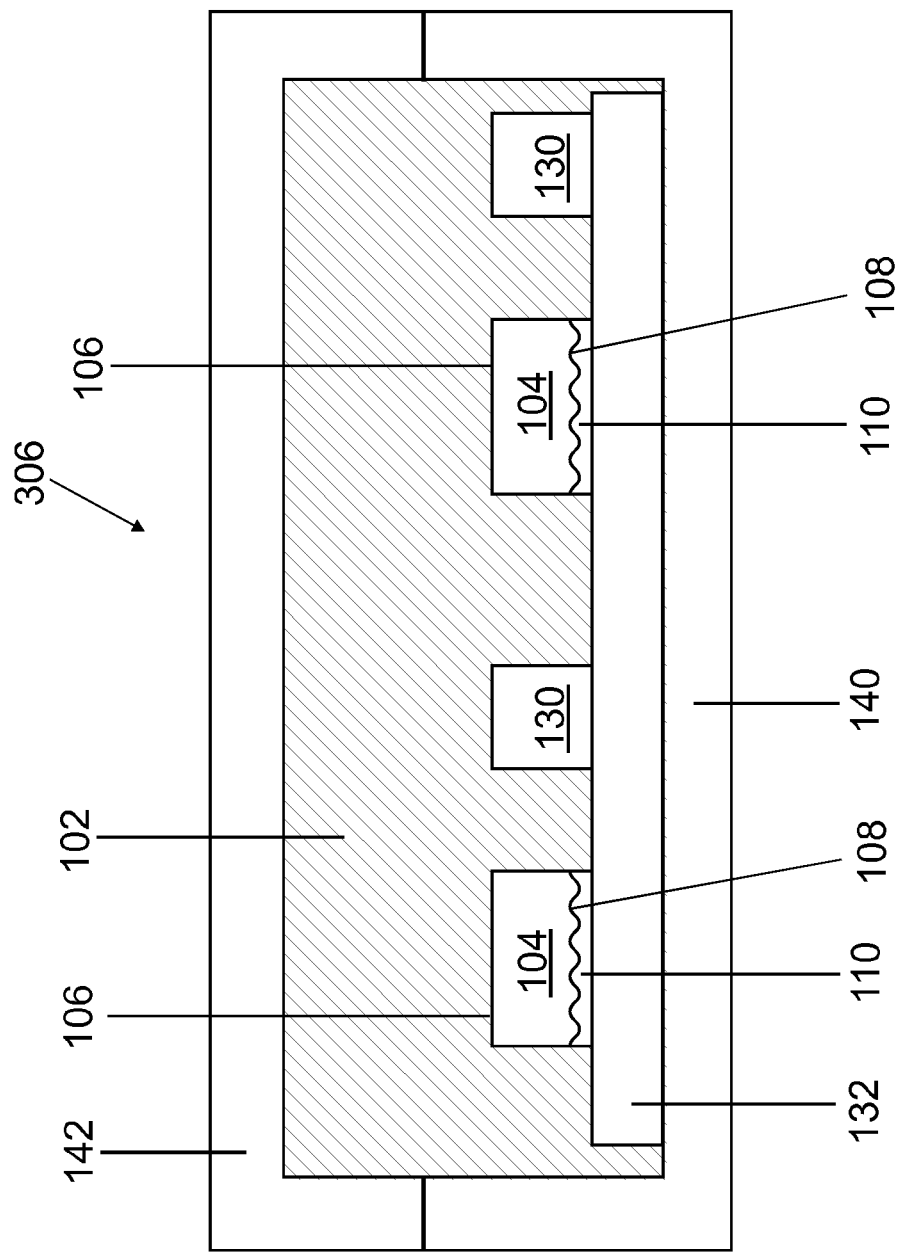

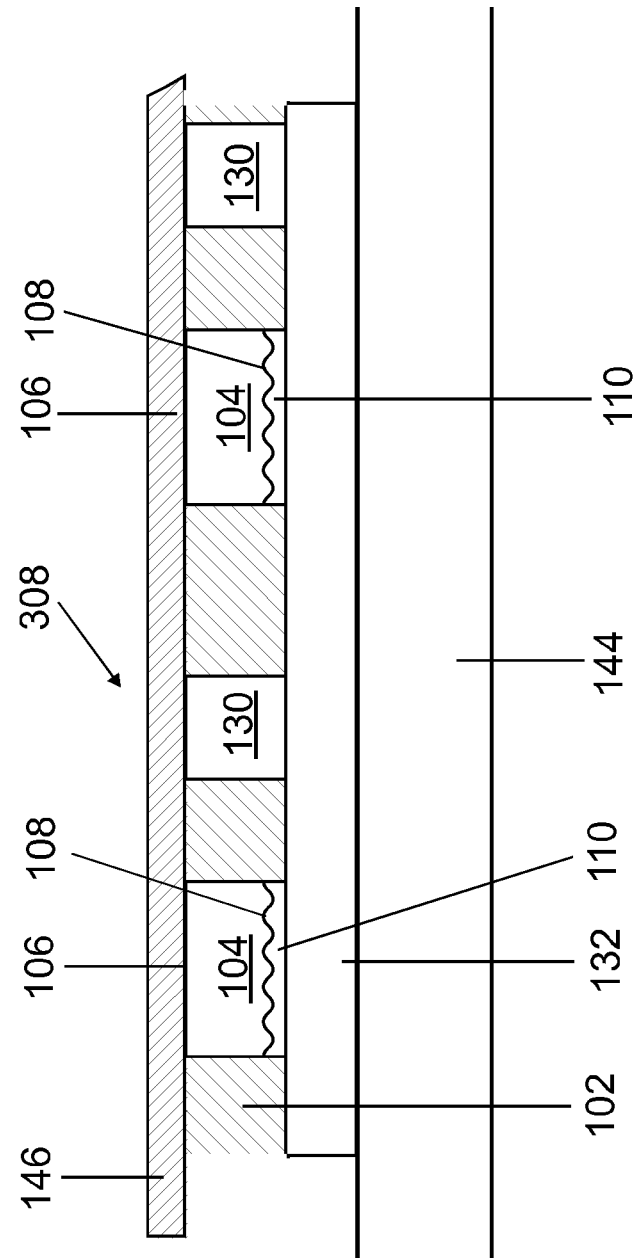

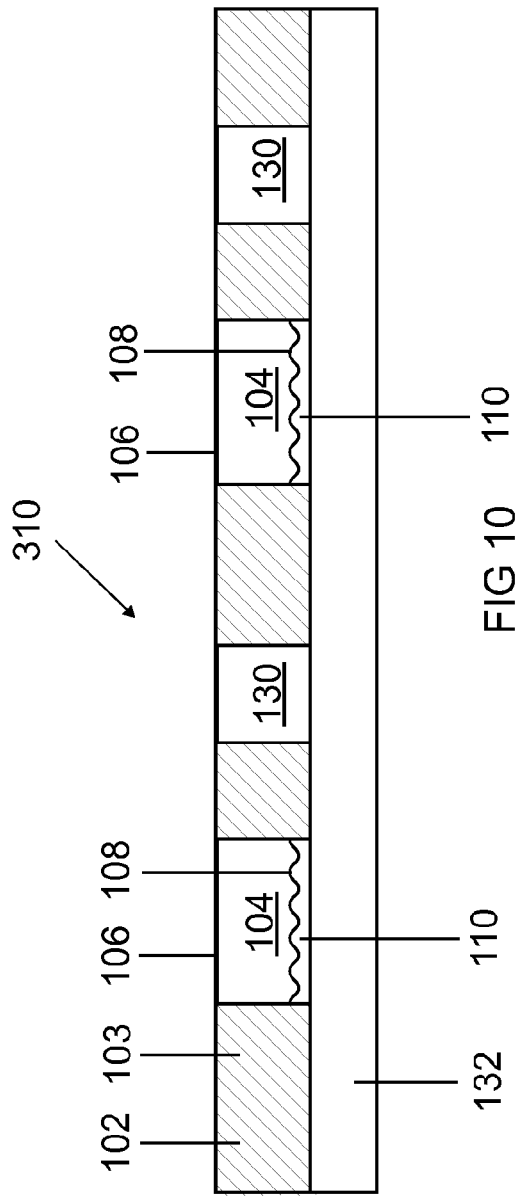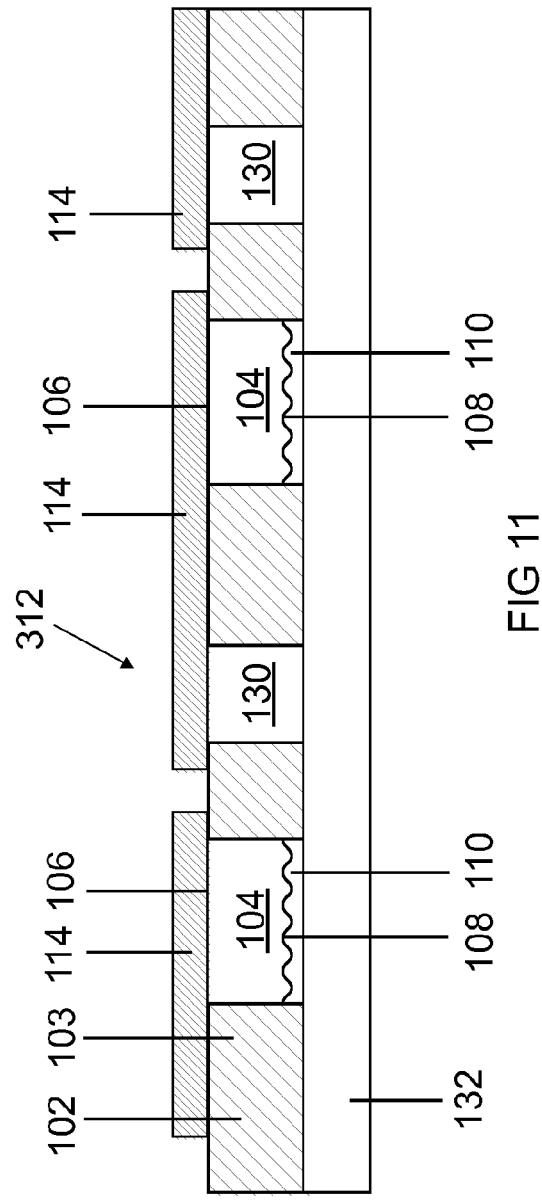

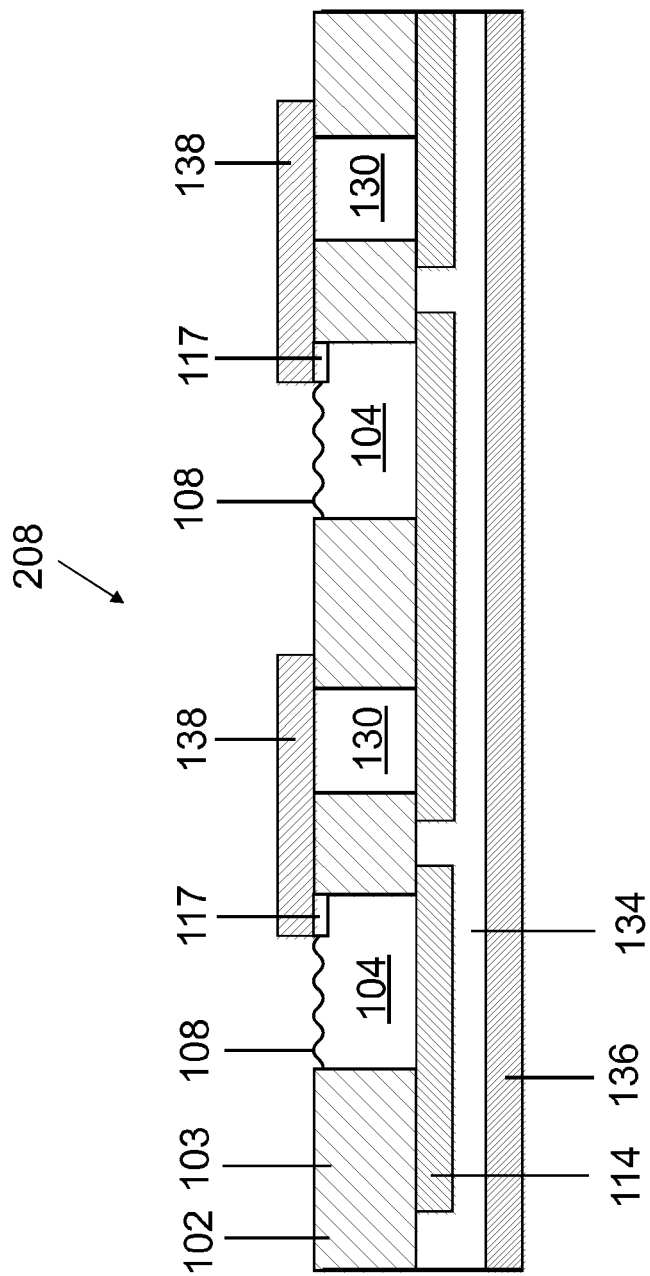

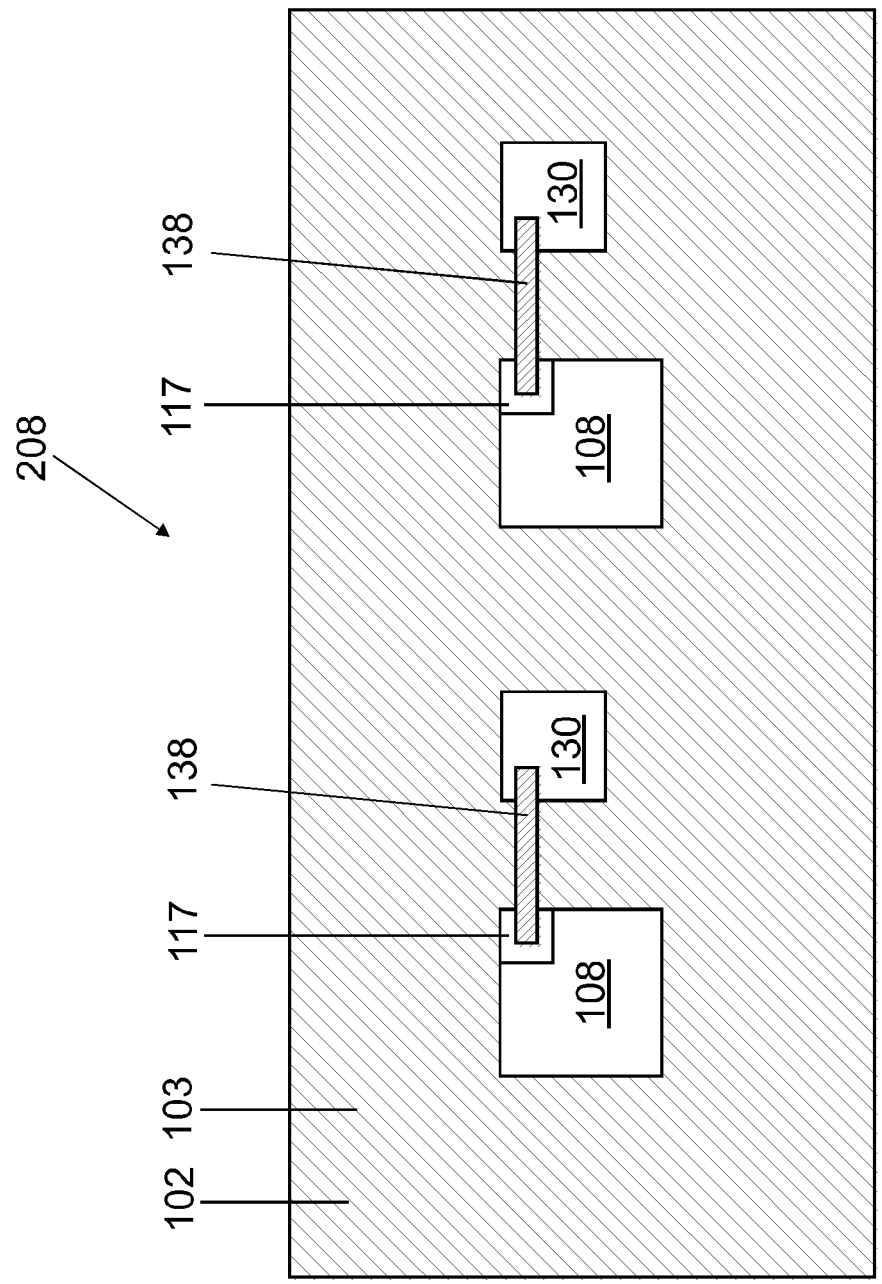

OPTOELECTRONIC MODULE AND METHOD FOR PRODUCING AN OPTOELECTRONIC MODULE

This patent application is a national phase filing under section 371 of PCT/EP2013/060053, filed May 15, 2013, which claims the priority of German patent application 10 2012 209 325.7, filed Jun. 1, 2012, each of which is incorporated herein by reference in its entirety.

TECHNICAL FIELD

The present invention relates to an optoelectronic module and to a method for producing an optoelectronic module.

BACKGROUND

Optoelectronic modules can comprise a plurality of semiconductor chips arranged on a carrier. One possible aim may be to provide a surface luminaire having a homogeneous luminance. However, the requisite arrangement of many semiconductor chips can be disadvantageous for reasons of interconnectability and contact-connectability, inter alia.

SUMMARY

It is an object of the invention to specify an optoelectronic module and a method for producing an optoelectronic module which is particularly cost-effective.

An optoelectronic module comprises at least one semiconductor chip for emitting electromagnetic radiation. The semiconductor chip has a layer having a first conductivity, in particular a p-type conductivity, a layer having a second conductivity, in particular an n-type conductivity, an emission surface and a contact surface situated opposite the emission surface. A contact is applied on the emission surface. A frame composed of potting compound encloses the at least one semiconductor chip laterally at least regionally in such a way that the emission surface and the contact surface are substantially free of potting compound. A first contact structure is arranged at least regionally on the frame and at least regionally on the contact surface and serves for making electrical contact with the layer having a first conductivity. A second contact structure is arranged at least regionally on the frame and at least regionally on the contact of the emission surface and serves for making electrical contact with the layer having a second conductivity. The complete separation of optical and electrical functions is particularly advantageous in this case. The later application of an optical element, in particular a mixing element for spatially intermixing electromagnetic radiation, has a purely optical function. The first contact structure, the second contact structure and the contact on the emission surface have a purely electrical function.

Embedding the at least one semiconductor chip in a frame composed of potting compound and leading the contact structures over the frame are advantageous since the contact-connection of the at least one semiconductor chip is thereby simplified and made less expensive. In particular, the module according to the invention is suitable for contact-connection free of bonding wires.

Furthermore, it is advantageous that, according to the invention, firstly all electrical connections are realized before optical elements, such as mixing elements, for example, are emplaced. This makes it possible that the contact structures can be tested and, if necessary, reworked before the optical element is emplaced.

In one preferred embodiment, the semiconductor chips have an edge length of approximately 50 μm to approximately 200 μm. A multiplicity of such small semiconductor chips is advantageous for producing surface light sources having a homogeneous luminance.

As a result of the use of the frame composed of potting compound, the minimum distance between the semiconductor chips can attain values of approximately 20 μm.

The thickness of the frame substantially corresponds to the thickness of the semiconductor chip. This is advantageous since the semiconductor chip is completely surrounded by potting compound at its side surfaces and does not project beyond the frame. The minimum possible thickness of the frame is approximately 100 μm. The thickness of the semiconductor chip results from the thickness of the epitaxial layers and the thickness of the, in particular electrically conductive, substrate on which the epitaxial layers are applied. Germanium can serve as such a substrate. In this case, the thickness of the frame fluctuates, for example, by at most +/−10%, in particular by at most +/−5%, around the maximum thickness of the semiconductor chip.

In one preferred embodiment, the potting compound comprises at least one of the following materials: silicone, epoxy resin, or hybrid materials.

Silicone as potting compound is particularly advantageous since it is thermally stable. Moreover, silicone is radiation-stable relative to electromagnetic radiation in the entire visible spectral range. Epoxy resin as potting compound is particularly advantageous since it is inexpensive. Hybrid materials are particularly advantageous since they combine the advantages of silicone and epoxy resin.

In one preferred embodiment, particles are dispersed into the potting compound, said particles comprising at least one of the following materials: titanium dioxide ($TiO_2$), aluminum oxide ($Al_2O_3$), zirconium oxide ($ZrO$), or barium difluoride ($BaF_2$).

These particles act as scattering particles having a diffuse reflectivity (angle of incidence is usually not equal to angle of reflection). The scattering particles can advantageously have a grain size of approximately 500 nm to approximately 3 μm. The diameter of the scattering particles is thus in the range of the wavelength of the light that is intended to be scattered.

As an alternative or in addition to the scattering particles, specularly reflective particles (angle of incidence is usually equal to angle of reflection) can be introduced into the potting compound, said particles comprising at least one of the following materials: silver (Ag), aluminum (Al), or quantum dots.

Scattering particles and specularly reflective particles in the potting compound are advantageous since these particles reflect at least part of the impinging light. The absorption losses in the potting compound are thereby reduced.

In one preferred embodiment, particles comprising silicon dioxide ($SiO_2$) are dispersed into the potting compound. This is advantageous since the $SiO_2$ particles lead to a reduction of the coefficient of thermal expansion of the potting compound.

In one preferred embodiment, particles comprising carbon black are dispersed into the potting compound. The use of carbon black particles is advantageous for applications in which light that impinges on the potting compound is intended to be absorbed.

The first and second contact structures comprise electrically conductive material. The electrically conductive material can comprise metals and metallic alloys.

In one preferred embodiment, the contact on the emission surface has a transparent contact layer, in particular composed of indium tin oxide and/or zinc oxide. The transparent contact layer covers the emission surface of the semiconductor chip at least regionally, preferably over the whole area. The absence of metallic contact structures on the light emission side of the semiconductor chip enables a planar surface of the semiconductor chip. This planar surface is advantageous for efficiently coupling electromagnetic radiation from the semiconductor chip into a downstream optical element, such as a mixing element. It is particularly advantageous that the shading by the bonding wire is omitted. Moreover, no light-emitting area is lost owing to a bonding pad on the emission surface of the semiconductor chip.

In one alternative preferred embodiment, the contact on the emission surface has a contact pad. The contact pad covers less than 30%, preferably less than 15%, of the emission surface. The contact pad can comprise a metal such as gold or silver or a metallic alloy and can be in direct contact with the emission surface. The electrical contact between the portion of the second contact structure that runs on the frame and the contact pad on the emission surface is produced by an electrically conductive, substantially planar contact layer. The technology for producing such planar contact layers is described in a different context in the document US 2009/0127573, for example, the disclosure content of which is hereby expressly incorporated by reference. The planar layer can have a thickness of between 5 µm and 60 µm, preferably between 15 µm and 25 µm. The width of the planar layer can be between 5 µm and 200 µm, preferably between 15 µm and 100 µm. The use of the above planar layer for making contact with the contact pad is advantageous since the planar layer has a high current-carrying capacity and a small structural height in comparison with a conventional bonding wire. Moreover, the above planar layer can make contact with comparatively small contact pads. The shading by said comparatively small contact pads is significantly reduced compared with the shading by the comparatively large bonding pads in the case of conventional wire bonding. The contact pads according to the invention are smaller than conventional bonding pads by an area factor of 10 to 100.

In one preferred embodiment, an electrically insulating insulation layer, in particular composed of a dielectric, is applied on that side of the frame which adjoins the contact surface and on the contact surface itself. A, more particularly metallic, heat sink is applied to the insulation layer. The heat sink leads to heat spreading, that is to say a distribution of the heat over the area. This is particularly advantageous when using semiconductor chips of relatively high power. The spread heat can then be better emitted to the ambient air by means of convection.

In one preferred embodiment, the first contact structure is applied on that side of the frame which adjoins the contact surface. The second contact structure is applied on that side of the frame which adjoins the emission surface.

In one preferred embodiment, the optoelectronic module comprises a conversion element. The conversion element can comprise silicone or a ceramic material as host material. Phosphor particles can be embedded into the host material. The conversion element is disposed downstream of the semiconductor chip in the emission direction. The conversion element is advantageous for converting short-wave primary light into longer-wave secondary light in an efficient manner. Phosphor particles can convert, in particular, blue light into yellow light. The phosphor particles can comprise at least one of the following materials: lanthanum-doped yttrium oxide ($Y_2O_3$—$La_2O_3$), yttrium aluminum granate ($Y_3Al_5O_{12}$), dysprosium oxide ($Dy_2O_3$), aluminum oxynitride ($Al_{23}O_{27}N_5$), or aluminum nitride (AlN).

In one preferred embodiment, the optoelectronic module comprises a mixing element. The mixing element serves for spatially and spectrally intermixing the electromagnetic radiation of the at least one semiconductor chip. The mixing element is disposed downstream of the at least one semiconductor chip in the emission direction. The mixing element can comprise at least one of the matrix materials: glass ($SiO_2$), silicone, polymethyl methacrylate (PMMA), or polycarbonate (PC).

The use of glass or silicone is particularly advantageous since these materials are cost-effective and simple in terms of processing.

With the use according to the invention of the mixing element, the complete separation of optical and electrical functions is particularly advantageous. The mixing element for spatially intermixing electromagnetic radiation has a purely optical function. The first contact structure, the second contact structure and the contact on the emission surface have a purely electrical function.

In an advantageous manner, scattering particles can be embedded into the matrix material of the mixing element. The scattering particles comprise at least one of the following materials: titanium dioxide ($TiO_2$), aluminum oxide ($Al_2O_3$), zirconium oxide (ZrO), or barium difluoride ($BaF_2$).

The use of scattering particles is particularly advantageous since the minimum thickness of the mixing element that is required for intermixing the light can be reduced by means of the scattering particles.

In one preferred embodiment, a structured mirror layer, in particular a metallic mirror layer, or a structured scattering layer, in particular composed of silicone into which scattering particles are dispersed, is arranged at least regionally between the frame and the mixing element. Such a mirror layer or scattering layer is advantageous since light not coupled out can be reflected into the mixing element and can subsequently be emitted by the optoelectronic module.

The structured mirror layer or the structured scattering layer can be arranged between the frame and the mixing element in such a way that the semiconductor chip of the module is surrounded by the structured mirror layer or the structured scattering layer in a frame-like manner at its emission surface. Electromagnetic radiation generated during operation then enters the mixing element from the emission surface through a cutout in the structured mirror layer or in the structured scattering layer.

For the case where the optoelectronic module comprises at least two semiconductor chips, regions of the structured mirror layer or of the structured scattering layer are arranged between directly adjacent semiconductor chips of the module. The structured mirror layer or the structured scattering layer then also serves for optical decoupling between adjacent semiconductor chips.

In one preferred embodiment, a transparent refractive index matching element, in particular composed of silicone, is provided between the emission surface and the mixing element. Such a silicone-based matching element is also called "index matching gel". The refractive index of the transparent refractive index matching element is between the refractive index of the semiconductor chip and the refractive index of the mixing element. This is advantageous since the electromagnetic radiation emitted by the semiconductor chip can be coupled into the mixing element more efficiently.

In one preferred embodiment, the distance between adjacent semiconductor chips substantially corresponds to the thickness of the mixing element. In this case, "substantially" can mean that the thickness of the mixing element deviates by at most +/−10%, preferably by +/−5%, around the distance between directly adjacent semiconductor chips. Preferred values for the thickness are between 1 mm and 10 mm, preferably between 3 mm and 6 mm, particularly preferably 4 mm. Complying with the above relationship between thickness of the mixing element and distance between the semiconductor chips is advantageous since a sufficient mixing of the Lambertian light emission of the individual semiconductor chips can be achieved as a result. This enables a surface luminaire having a substantially homogeneously luminous surface.

In one preferred embodiment, at least two semiconductor chips are provided. In the simplest case, the semiconductor chips are interconnected in parallel with one another. In a further preferred embodiment, the semiconductor chips are interconnected in series with one another. The series interconnection is particularly advantageous since it enables a substantially homogeneous current distribution among the semiconductor chips. In a further preferred embodiment, a plurality of strings of semiconductor chips can be energized in parallel, wherein the semiconductor chips in each string are energized in series.

In one preferred embodiment, at least one electrical feedthrough is provided in the frame composed of potting compound. The electrical feedthrough can comprise a metal. The electrical feedthrough can be produced from a copper foil by stamping out or laser processing. Alternatively, the electrical feedthrough can comprise silicon. The electrical feedthrough electrically conductively connects the first contact structure of a semiconductor chip to the second contact structure of an adjacent semiconductor chip. The electrical feedthrough is absolutely necessary for a series interconnection of the semiconductor chips.

In accordance with at least one embodiment of the module described here, the mixing element has at least one cavity at its underside facing the semiconductor chip. In this case, the cavity is embodied in particular in such a way that it does not completely penetrate through the mixing element. If the module comprises two or more semiconductor chips, then the mixing element has two or more cavities, wherein a cavity of the mixing element is assigned one-to-one to each semiconductor chip.

The cavities are arranged at that side of the mixing element which faces the emission surfaces of the semiconductor chips. In particular, each cavity can comprise a conversion element disposed downstream of the assigned semiconductor chip in the emission direction. By way of example, the conversion element is formed with a matrix material, such as silicone, into which particles of one or a plurality of phosphors are introduced. Each cavity can be completely filled with a conversion element, wherein different cavities can comprise different conversion elements. Thus, it is then possible, for example, for light of different colors or white light of different color temperatures to be emitted by different conversion elements.

Furthermore, a method for producing an optoelectronic module is specified. In particular, a module described here can be produced by the method. That is to say that all features described for the module are also disclosed for the method, and vice versa. In this case, a method described here comprises, in particular, the following steps:

applying at least one semiconductor chip for emitting electromagnetic radiation to an adhesive foil, wherein the semiconductor chip has a layer having a first conductivity, a layer having a second conductivity, an emission surface with a contact, and a contact surface situated opposite the emission surface, and wherein the emission surface faces the adhesive foil;

applying a frame composed of potting compound, for example, by potting, to the exposed regions of the adhesive foil, in such a way that the semiconductor chip is enclosed laterally at least regionally by potting compound;

applying a first contact structure to the frame and to the contact surface for making electrical contact with the layer having a first conductivity, for example, a p-type conductivity;

removing the adhesive foil;

applying a second contact structure to the frame and to the contact of the emission surface, for making electrical contact with the layer having a second conductivity, for example, an n-type conductivity.

The use of an adhesive foil for fixing the at least one semiconductor chip is advantageous since it is sufficient to place the semiconductor chips on the adhesive foil, without particularly close positioning tolerances having to be complied with. In this case, the adhesive strength of the adhesive foil should be chosen such that the semiconductor chips adhere firmly enough for the following method steps. However, the adhesive strength must be limited such that the adhesive foil can be detached from the semiconductor chips and from the frame composed of potting compound after the application of the first contact structure, without leaving residues or damaging the at least one semiconductor chip. Potting the at least one semiconductor chip in a frame composed of potting compound and leading the contact structures over the frame are advantageous since the contact-connection of the semiconductor chip is thereby simplified and made less expensive. Furthermore, it is advantageous that, according to the invention, firstly all electrical connections are realized before optical elements, such as mixing elements, for example, are emplaced. This makes it possible that the contact structures can be tested and, if necessary, reworked before the optical element is emplaced.

Applying the first and second contact structures can be effected by applying a metallization in a planar fashion. One possible advantage of planar conduction structures is that they can have a higher current-carrying capacity in comparison with bonding wires in traditional wiring bonding. Moreover, planar conduction structures make it possible to reduce the structural height of the optoelectronic component in comparison with traditional wire bonding.

The planar application of the metallization to the frame, to the contact on the emission surface and onto the contact surface can be effected directly in a structured fashion or by the use of so-called phototechnology.

For applying the metallization directly in a structured fashion, the following methods can alternatively be used.

In screen printing, a planar metallization is applied to the frame and to the semiconductor chips by the use of stencils or covering masks. In this case, an electrically conductive paste is applied by squeegee. In one process step, metallization thicknesses of approximately 30 µm can be achieved. Preferably, for an increased current conductivity and an increased stability of the metallized structure, the process step can be repeated multiply.

In dispensing, metal particles and an organic medium are admixed to form a paste and this paste is applied to the frame by means of a canula and a syringe using compressed air pulses. The paste is subsequently dried and subjected to heat treatment. What is particularly advantageous in this case is that an arbitrary form of the metallization can be achieved by means of the parameters of pressure and time. A metallization layer having very good adhesion is produced by dispensing. Thicknesses of the metallization layer of approximately 50 µm can be produced.

In jetting, droplets of electrically conductive material are applied to the frame from a supply container by means of short pulses. The material is cured after being applied. This method is particularly advantageous since it proceeds in a non-contacting fashion.

Alternative electrically conductive material can be sprayed onto the frame.

With the use of phototechnology, firstly a planar metallization as so-called seed layer is applied over the whole area to the frame, to the contact surface and to the emission surface, including contact, preferably by means of sputtering. Seed layer thicknesses of approximately 2 μm to 3 μm are preferably achieved in this case. A layer sequence composed of titanium and copper is preferably used as material for the seed layer. The titanium and the copper are preferably sputtered in one step, the titanium serving as adhesion promoter. Applying the contact structure on the frame, on the contact surface and on the contact of the emission surface comprises the following method steps.

Photolithography: photoresist is applied to the sputtered seed layer by rotary coating. The photoresist is then dried. The photoresist is subsequently exposed by means of a photomask. The latent image is then developed, wherein the exposed regions of the photoresist are removed. Alternatively, the method step of photolithography can also be performed such that the exposed regions of the photoresist remain after development.

Electrolytic reinforcement or electroplating of the contact structure. This method step is necessary since the current-carrying capacity of the seed layer would be too low on account of its small thickness. This involves a continuous electrochemical deposition of metallic deposits on the seed layer, in the regions in which the photoresist was removed during development. Thicknesses of the metallization of up to approximately 50 μm can be achieved during electroplating. Thicknesses of between 15 μm and 30 μm are particularly advantageous. Copper is preferably used as metallization material.

Removing the photoresist,

Etching away the seed layer that is not covered by the electrolytic reinforcement. This step prevents a short circuit.

The method for producing an optoelectronic module is particularly advantageous for a multiplicity of semiconductor chips, since the multiplicity of semiconductor chips potted in the so-called "artificial wafer" can be contact-connected simultaneously. This reduces the complexity of the contact-connection.

In one preferred embodiment, the step of applying the frame composed of potting compound is preceded by a step of applying at least one electrical feedthrough to the adhesive foil. This step is absolutely necessary for a series interconnection of a plurality of semiconductor chips.

In one preferred embodiment, the step of applying the frame composed of potting compound comprises the following substeps:

compression molding the potting compound enclosing the semiconductor chip and/or the electrical feedthrough at least regionally;

curing the potting compound;

grinding back the cured potting compound, in such a way that the contact surface and/or that surface of the electrical feedthrough which is situated opposite the adhesive foil are/is substantially freed of potting compound. This embodiment is particularly advantageous since the semiconductor chips and the electrical feedthroughs can be brought to a uniform height by means of the grinding-back step. This reduces the necessary accuracy when equipping the adhesive foil with semiconductor chips and electrical feedthroughs.

In an alternative preferred embodiment, the step of applying the frame composed of potting compound comprises the following substeps:

applying a cover foil, in particular composed of Teflon, to the contact surface and/or to that surface of the electrical feedthrough which is situated opposite the adhesive foil;

injection molding the potting compound into an interspace between cover foil and adhesive foil, in such a way that the semiconductor chip and/or the electrical feedthrough are/is substantially enclosed by potting compound at the sides which are not covered by the adhesive foil and not covered by the cover foil;

curing the potting compound;

removing the cover foil.

This alternative embodiment is particularly advantageous since, during potting, both the contact surface and the emission surface of the semiconductor chip remain free of potting compound. The grinding-back substep can therefore be omitted. This embodiment is also called "film assisted molding" and is a special case of injection molding.

In one preferred embodiment, the step of applying the first contact structure is succeeded by the following substeps:

applying an electrically insulating, in particular dielectric, layer;

applying a, more particularly metallic, heat sink.

This embodiment is particularly advantageous since the heat spreading enables an improved dissipation of heat from the semiconductor chips to the ambient air.

In one preferred embodiment, the step of applying the second contact structure is succeeded by the step of applying a mixing element. This step is advantageous since only the mixing element enables the spatial intermixing of the electromagnetic radiation emitted by the semiconductor chips.

In accordance with at least one embodiment of the method, for the purpose of forming the optoelectronic module, a multiplicity of semiconductor chips are provided, said semiconductor chips being provided for emitting electromagnetic radiation. The multiplicity of semiconductor chips are applied to the adhesive foil. In this case, the multiplicity of semiconductor chips are arranged in rows and columns on the adhesive foil. That is to say that, within the scope of the production tolerance, the semiconductor chips are arranged for example, at the lattice points of a regular lattice, for example, of a rectangular lattice, on the adhesive foil.

This is followed by the described processing of the arrangement comprising adhesive foil and semiconductor chips, for example, by means of the steps of applying the frame composed of potting compound and applying the first and second contact structures.

In at least one embodiment, after the first and second contact structures have been applied, that is to say after the wiring of the semiconductor chips, the arrangement comprising semiconductor chips and frame is severed through the frame between the rows and/or between the columns in order to produce modules of reduced size. By way of example, linear modules are produced in this way, which extend along a row or along a column of the semiconductor chips. Semiconductor chips of the linear modules have directly adjacent semiconductor chips only along their main extension direction.

In a further method step, the modules of reduced size are arranged on an auxiliary carrier, for example, a further adhesive foil, alongside one another in order to form the optoelectronic module. In this case, the distance between the modules of reduced size is chosen in such a way that the distance between directly adjacent semiconductor chips from different directly adjacent modules of reduced size is greater than the distance between directly adjacent semiconductor chips prior to severing.

In other words, the semiconductor chips are potted and wired in this method for semiconductor chips which are arranged relatively close to one another. The distance between the semiconductor chips is then increased in at least one direction by means of the severing into modules of reduced size and the arranging of the modules of reduced size at a greater distance from one another.

This can be followed by a further potting of the smaller modules on the auxiliary carrier, for example, with a reflective or a radiation-transmissive potting compound.

In this case, the method is based on the insight, inter alia, that a planar arrangement of semiconductor chips which is not occupied very densely with the semiconductor chips produces high costs in the wiring of the semiconductor chips. In the method, therefore, the semiconductor chips are wired in a state in which they are still close to one another. In a next method step, the distances between the semiconductor chips are increased in at least one direction in such a way that the module generates light with the desired emission characteristics during operation of the semiconductor chips. For this purpose, by way of example, linear modules or bars are produced by the severing and subsequently, if appropriate, are potted again on the auxiliary carrier.

Alternatively or additionally, further method steps described here can be effected, such as, for example, applying a mixing element for spatial intermixing and applying a structured mirror layer or a structured scattering layer between the mixing element and the frame.

BRIEF DESCRIPTION OF THE DRAWINGS

Various exemplary embodiments are explained in greater detail below with reference to the drawings. Elements that are identical, of identical type or act identically are provided with the same reference signs in the figures. The figures and the size relationships of the elements illustrated in the figures among one another should not be regarded as to scale. Rather, individual elements may be illustrated with exaggerated size or size reduction in order to enable better illustration and in order to afford a better understanding.

FIG. 1a shows a first exemplary embodiment of an optoelectronic module according to the invention in sectional view;

FIG. 1b shows the optoelectronic module according to the invention from FIG. 1a in plan view;

FIG. 4a shows a second exemplary embodiment of an optoelectronic module according to the invention in sectional view;

FIG. 4b shows the optoelectronic module according to the invention from

FIG. 4a in plan view;

FIG. 6 shows the intermediate product after performing step S1 of the production method in sectional view;

FIG. 7 shows the alternative intermediate product after performing step S1 of the production method in sectional view;

FIG. 8 shows the arrangement when performing step S2A of the production method in sectional view;

FIG. 9 shows the arrangement when performing step S2B—alternative to S2A—of the production method in sectional view;

FIG. 10 shows the intermediate product after performing step S2A or S2B of the production method in sectional view;

FIG. 11 shows the intermediate product after performing step S3 of the production method in sectional view;

FIG. 16a shows a fourth exemplary embodiment of an optoelectronic module according to the invention in sectional view after performing step S6 of the production method;

FIG. 16b shows the optoelectronic module according to the invention from FIG. 16a in plan view;

DETAILED DESCRIPTION OF ILLUSTRATIVE EMBODIMENTS

Figure 2:
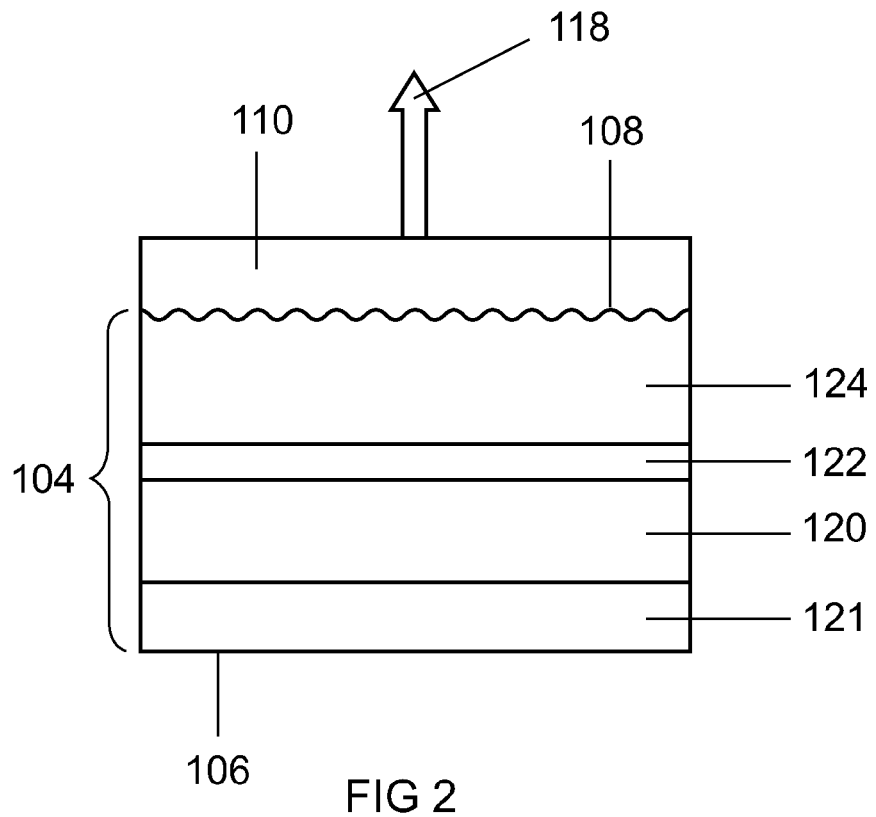
FIG. 2 shows a first semiconductor chip in sectional view.

FIG. 1a shows a first exemplary embodiment of an optoelectronic module 202 according to the invention in sectional view. Said module 202 comprises a semiconductor chip 104 for emitting electromagnetic radiation 118. The semiconductor chip 104 has a plurality of epitaxial layer sequences (not shown in FIG. 1a; see FIGS. 2 and 3). The semiconductor chip has an emission surface 108, which is defined as that surface of the epitaxial layers at which the electromagnetic radiation 118 emerges from the semiconductor chip 104. The emission surface 108 has a coupling-out structure (illustrated as a wavy line), which increases the coupling-out efficiency of the electromagnetic radiation 118 from the semiconductor chip 104 via the emission surface 108. A first contact is arranged on the emission surface 108, said first contact being embodied as a transparent contact layer 110. In the present case, transparent means that electromagnetic radiation from the visible spectral range passes through the contact layer 110 without significant absorption losses.

The transparent contact layer 110 covers the emission surface 108 over the whole area. In an alternative exemplary embodiment (not shown), the transparent contact layer 110 can cover the emission surface 108 only regionally. A contact surface 106 of the semiconductor chip 104 is situated opposite the emission surface 108. The contact surface 106 serves as a second electrical contact of the semiconductor chip 104. A frame 103 composed of potting compound 102 laterally completely encloses the semiconductor chip 104. The potting compound 102 terminates substantially flush with that surface of the transparent contact layer 110 which faces away from the semiconductor chip 104, and with the contact layer 106. The emission surface 108, to put it more precisely the transparent contact layer 110, and the contact surface 106 are free of potting compound 102. The flush termination of the potting compound 102 is advantageous since stable contact structures can be applied to such planar structures in a particularly simple manner.

In an exemplary embodiment that is not illustrated in the figures, the potting compound 102 encloses the side surfaces of the semiconductor chip 104 only regionally. Moreover, a step can be formed at the boundary between contact surface 106 and potting compound 102 and/or at the boundary between transparent contact layer 110 and potting compound 102.

In FIG. 1a, a first contact structure 114 is arranged at least regionally on the frame 103 and at least regionally on the contact surface 106. The first contact structure 114 serves for making electrical contact with a layer having a first conductivity (not shown in FIG. 1a; see FIGS. 2 and 3) of the semiconductor chip 104. A second contact structure 116 is arranged in a planar fashion on the frame 103 and regionally on the transparent contact layer 110. The second contact structure 116 serves for making electrical contact with a layer having the second conductivity (not shown in FIG. 1a; see FIGS. 2 and 3) of the semiconductor chip 104. The second contact structure 116 has an overlap region 112 over the edge of the transparent contact layer 110 of, for example, 5 μm.

By virtue of the overlap region 112, the second contact structure 116 is in mechanical and electrical contact with the transparent contact layer 110, which covers the emission surface 108 over the whole area. An overlap region of only a few μm is advantageous since only a small part of the emission surface 108 and of the transparent contact layer 110 is shaded. Therefore, even in the case of small semiconductor chips 104 having edge lengths of, for example, only 50 μm, it is possible to achieve a high coupling-out efficiency for the electromagnetic radiation 118 from the semiconductor chip 104. The transparent contact layer 110 comprises, for example, indium tin oxide (ITO) or zinc oxide.

The first contact structure 114 is applied on that side of the frame 103 which adjoins the contact surface 106. The second contact structure 116 is applied on that side of the frame 103 which adjoins the emission surface 108 and the transparent contact layer 110.

The potting compound 102 comprises at least one of the following materials as host material:
silicone
epoxy resin
hybrid materials.

Particles can be dispersed into the potting compound 102, said particles comprising at least one of the following materials:
titanium dioxide ($TiO_2$),
aluminum oxide ($Al_2O_3$),
zirconium oxide (ZrO),
barium difluoride ($BaF_2$)
silicon dioxide ($SiO_2$)
carbon black.

The particles are not illustrated in FIG. 1a.

FIG. 1b shows the optoelectronic module according to the invention from FIG. 1a in plan view. The second contact structure 116 encloses the transparent contact layer 110 at all four sides. This enables a uniform energization of the semiconductor chip 104 via the contact layer 110. The second contact structure 116 has an overlap region 112 with the transparent contact layer 110 at all four sides of the transparent contact layer 110. The second contact structure 116 has a width that is greater than the width of the transparent contact layer 110. In an exemplary embodiment that is not shown, the second contact structure 116 can make contact with only one, two or three sides of the transparent contact layer 110. Particularly for small semiconductor chips 104, substantially having edge lengths of less than 200 μm, this can be sufficient for the energization.

FIG. 2 shows a first semiconductor chip 104 in sectional view. The semiconductor chip 104 has an electrically conductive substrate 121, which terminates with a contact surface 106 at a base surface. The substrate 121 can comprise germanium or silicon, for example. The substrate 121 serves as contact-making and fixing means for subsequent epitaxial layers of the semiconductor chip 104 and is regarded as part of the semiconductor chip 104 in the present application. A layer having a first conductivity 120, in particular a p-type conductivity, is disposed downstream of the substrate 121. An active zone 122 is disposed downstream of the layer having a first conductivity. A layer having a second conductivity 124, in particular an n-type conductivity, is disposed downstream of the active zone 122. Alternatively, the layer having a first conductivity 120 can be n-conducting and the layer having a second conductivity 124 can be p-conducting. The layer having a first conductivity 120, the active zone 122 and the layer having a second conductivity 124 are grown epitaxially one on top of another.

The electromagnetic radiation 118 leaves the semiconductor chip 104 via the emission surface 108. The emission surface 108 has a coupling-out structure, which is illustrated as a wavy line in FIG. 2. The coupling-out structure can comprise a pyramid structure, for example, this not being illustrated in detail in FIG. 2 for the sake of clarity. The emission surface 108 is covered over the whole area with an electrically conductive, transparent contact layer 110, for example, composed of indium tin oxide (ITO). After emerging from the emission surface 108, the electromagnetic radiation 118 passes through the transparent contact layer 110. The absorption of the electromagnetic radiation 118 in the transparent contact layer 110 is sufficiently low given a suitable choice of material. The transparent contact layer 110 is not regarded as part of the semiconductor chip 104 in the present application.

Figure 3:
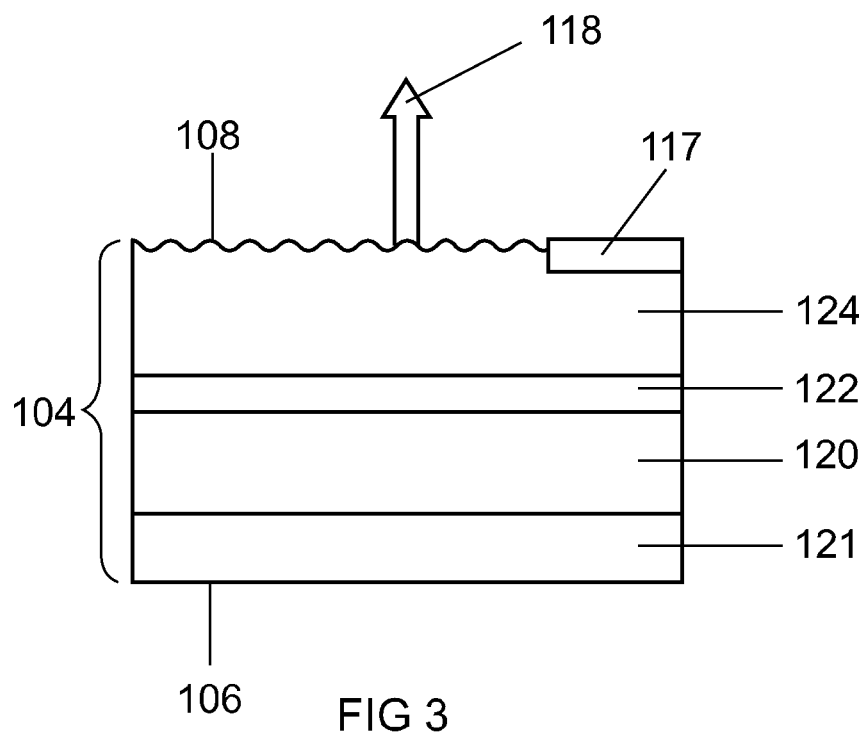
FIG. 3 shows a second semiconductor chip in sectional view.

FIG. 3 shows a second semiconductor chip 104 in sectional view. The semiconductor chip 104 in FIG. 3 substantially corresponds to the semiconductor chip in FIG. 2, except that: a contact pad 117 is applied directly on the emission surface 108 of the semiconductor chip 104. The contact pad 117 is not regarded as part of the semiconductor chip 104 in the present application. The contact pad 117 comprises an electrically conductive metal or a metallic alloy. The contact pad 117 has the same function as the transparent contact layer 110 from FIG. 2, that is to say the energization of the layer having a second conductivity 124. The contact pad 117 covers, for example, less than 30%, preferably less than 15%, of the emission surface 108.

The edge length of the emission surface 108 of the semiconductor chip 104 in FIG. 2 and FIG. 3 can be between approximately 50 μm and approximately 1000 μm.

The smaller the semiconductor chip 104, the smaller the contact pad 117 on the emission surface 108 should be chosen to be, in order to minimize the shading of the electromagnetic radiation 118 by the contact pad 117.

The electromagnetic radiation 118 is generated in the active zone 122 illustrated in FIG. 2 and FIG. 3. The active zone 122 can be a pn junction, a double heterostructure, a multi quantum well structure (MQW) or a single quantum well structure (SQW). Quantum well structure means: quantum wells (3-dim), quantum wires (2-dim) and quantum dots (1-dim).

The semiconductor chip 104, to put it more precisely the layer stack comprising the layer having a first conductivity 120, the active zone 122 and the layer having a second conductivity 124 grown epitaxially one on top of another, can be based on a III-V compound semiconductor material. III-V compound semiconductor materials are advantageous since high internal quantum efficiencies can be obtained when generating radiation.

The semiconductor chip 104 comprises aluminum indium gallium nitride ($Al_xIn_yGa_{1-x-y}N$), for example. In this case, it holds true that $0 \leq x \leq 1$, $0 \leq y \leq 1$ and $x+y \leq 1$, in particular where $x \neq 1$, $y \neq 1$, $x \neq 0$ and/or $y \neq 0$. This semiconductor chip 104 can emit electromagnetic radiation 118 from the ultraviolet spectral range through the blue spectral range to the green spectral range.

The semiconductor chip 104 comprises aluminum indium gallium phosphide ($Al_xIn_yGa_{1-x-y}P$), for example. In this case, it holds true that $0 \leq x \leq 1$, $0 \leq y \leq 1$ and $x+y \leq 1$, in particular where $x \neq 1$, $y \neq 1$, $x \neq 0$ and/or $y \neq 0$. This semiconductor chip 104 can emit electromagnetic radiation 118 from the red spectral range to the yellow spectral range.

By way of example, the semiconductor chip 104 can be embodied as a surface emitter, in particular as a so-called thin-film chip. The use of a surface emitter is particularly advantageous since its light can be coupled into downstream optical elements, such as mixing elements, for example, particularly efficiently. The thin-film chip is known from the published patent application WO 2005081319 A1, also published as U.S. Pat. No. 8,835,937 B2, for example, the disclosure of which is hereby incorporated by reference in the disclosure of the present application.

FIG. 4a shows a second exemplary embodiment of an optoelectronic module 204 according to the invention in sectional view. The exemplary embodiment in FIG. 4a differs from the exemplary embodiment in FIG. 1a only in the way in which contact is made with the layer having a second conductivity (not shown in FIG. 4a). For the rest, the explanations with regard to the first exemplary embodiment in FIG. 1a hold true. Instead of the transparent contact layer 110 in FIG. 1a, in FIG. 4a a contact pad 117 is applied on the emission surface 108. The contact pad 117 is electrically conductively contact-connected by a second contact structure in the form of a planar contact layer 138. In the present case, the term planar contact layer 138 is used as delimitation with respect to conventional wire bonding. In contrast to a bonding wire, the planar contact layer 138 has a planar embodiment.

Figure 4B:
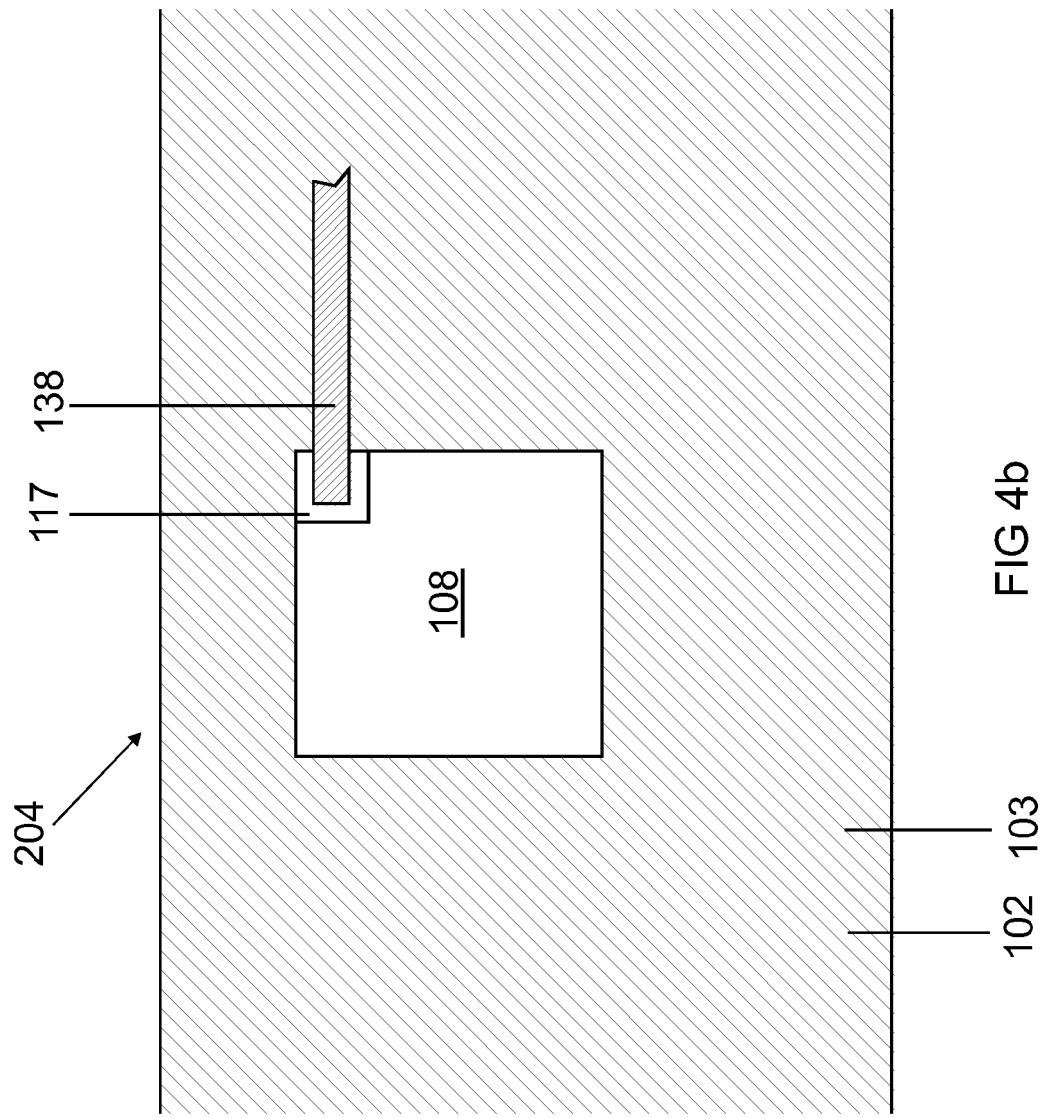

FIG. 4b shows the optoelectronic module 204 according to the invention from FIG. 4a in plan view. The contact pad 117 is applied directly on the emission surface 108. The contact pad 117 is electrically contact-connected via the planar contact layer 138. In the present exemplary embodiment, the planar contact layer 138 has the same function as the second contact structure 116 in the exemplary embodiment from FIG. 1b. The planar contact layer 138 can have the form of an elongate strip. The planar contact layer 138 has an extension (width) perpendicular to its main extension direction of 5 μm to 150 μm, preferably of 10 μm to 50 μm. The width to be chosen for the planar contact layer 138 is dependent on the size of the contact pad 117 that is intended to be contact-connected, and on the required current-carrying capacity. The planar contact layer 138 can have, for example, a thickness of 5 μm to 60 μm, preferably of 15 μm to 25 μm.

Figure 5:
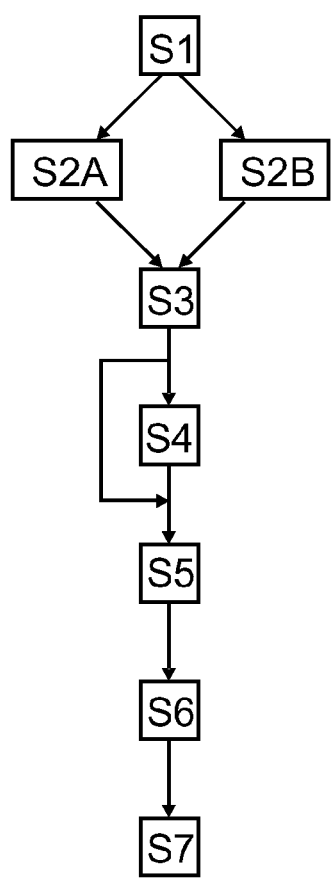
FIG. 5 shows the steps of the production method according to the invention.

FIG. 5 shows steps S1 to S7 of the method according to the invention for producing an optoelectronic module.

In step S1, at least one semiconductor chip 104 for emitting electromagnetic radiation 118 is applied to an adhesive foil 132. The semiconductor chip 104 has an emission surface 108 and a contact surface 106 situated opposite the emission surface 108. A transparent contact layer 110 is applied on the emission surface 108 in the emission direction. During application, the emission surface 108 of the semiconductor chip 104 and thus also the transparent contact layer 110 face the adhesive foil 132. At least one electrical feedthrough 130, for example, composed of copper or silicon is applied to the adhesive foil 132. In an exemplary embodiment that is not shown, the electrical feedthroughs 130 can be dispensed with.

FIG. 6 illustrates the intermediate product 302 after step S1 has been performed. The transparent contact layers 110 disposed downstream of the two semiconductor chips 104 in the emission direction adhere by their planar surfaces directly on the adhesive foil 132. As a result, the two semiconductor chips 104 are mechanically fixed on the adhesive foil 132 for the subsequent steps of the production method. Likewise, two electrical feedthroughs 130 are arranged on the adhesive foil 132. In exemplary embodiments that are not illustrated, the intermediate product of step S1 has an individual semiconductor chip 104 or a multiplicity of semiconductor chips 104. In exemplary embodiments that are not illustrated, the intermediate product of step S1 has no, one or a multiplicity of electrical feedthroughs 130.

FIG. 7 illustrates the alternative intermediate product 304 in relation to FIG. 6 after step S1 has been performed. Two semiconductor chips 104 and two electrical feedthroughs 130 are fixed on the adhesive foil 132. The emission surfaces 108 and the contact pads 117 are in direct contact with the adhesive foil 132. In exemplary embodiments that are not illustrated, the intermediate product of step S1 has an individual semiconductor chip 104 or a multiplicity of semiconductor chips 104. In exemplary embodiments that are not illustrated, the intermediate product of step S1 has no, one or a multiplicity of electrical feedthroughs 130.

In step S1, the semiconductor chips 104 and the electrical feedthroughs 130 are merely placed on the adhesive foil 132. There is no need for separate adhesive bonding or soldering of the semiconductor chips 104 and the electrical feedthroughs 130 onto a carrier.

In step S2, a frame 103 composed of potting compound 102 is applied to the exposed regions of the adhesive foil 132 in such a way that the semiconductor chips 104 are enclosed laterally at least regionally by potting compound 102. The contact surfaces 106 and the emission surfaces 108 or the transparent contact layers 110 of the semiconductor chips 104 are substantially freed of potting compound 102. Step S2 can be performed by two different methods S2A or S2B and leads to the same intermediate product 310.

In the variant S2A, potting compound 102 enclosing the semiconductor chips 104 and/or the electrical feedthroughs 130 at least regionally is compression-molded. FIG. 8 shows the arrangement when step S2A is performed, in sectional view. This arrangement is designated as intermediate product 306. The step of compression molding is illustrated. The base of the mold 140 encloses the adhesive foil 132, onto which the two semiconductor chips 104 and the two electrical feedthroughs 130 are adhesively bonded. The cover of the mold 142 together with the base 140 forms a cavity, which is filled with potting compound 102, for example, with silicone. The potting compound 102 completely encloses those areas of the semiconductor chips 104 and of the electrical feedthroughs 130 that are not covered by the adhesive foil 132. After the molding step, the potting compound 102 is cured. The curing can be effected by the action of thermal energy or by irradiation by electromagnetic irradiation, in particular from the UV range. The cured potting compound 102 is subsequently ground back in such a way that the contact surfaces 106 of the two semiconductor chips 104 and those surfaces of the two electrical feedthroughs 130 which are situated opposite the adhesive foil 132 are substantially freed of potting compound 102.

In the variant S2B, the potting compound 102 is introduced by injection molding. FIG. 9 shows the arrangement when the alternative step S2B is performed, in sectional view. This arrangement is designated as intermediate product 308. The step of injection molding is illustrated. The adhesive foil 132 with the two semiconductor chips 104 and the two electrical feedthroughs 130 is arranged on a carrier 144 of a mold. Afterward, a cover foil 146, for example, composed of Teflon, is applied to the contact surface 106 of the two semiconductor chips 104 and to those surfaces of the two electrical feedthroughs 130 which are situated opposite the adhesive foil 132. Potting compound 102 is subsequently injected into the interspace between cover foil 146 and adhesive foil 132, in such a way that the semiconductor chips 104 and the electrical feedthroughs 130 are completely enclosed by potting compound 102 at the sides which are not covered by the adhesive foil 132 and not covered by the cover foil 146. The potting compound 102 is subsequently cured. Finally, the cover foil 146 is removed. This special case of injection molding is also called film assisted molding.

The adhesive foil 132 is, for example, a plastic foil that is adhesive on both sides. The side of the adhesive foil 132 to which the semiconductor chips 104 and the electrical feedthroughs 130 are applied remains adhesive at all temperatures that occur. The side of the adhesive foil 132 which faces the metallic carrier 140, 144 of the mold loses its adhesive strength starting from a specific temperature (thermo-release). The adhesive foil 132 therefore detaches from the carrier 140, 144 of the mold independently starting from a specific temperature.

FIG. 10 shows the intermediate product 310 after step S2A or S2B has been performed, in sectional view. The two semiconductor chips 104 and the two electrical feedthroughs 130 are completely surrounded by cured potting compound 102 at their side surfaces. The cured potting compound 102 forms a frame 103 around the two semiconductor chips 104 and around the two electrical feedthroughs 130. The frame 103 terminates flush with the contact surfaces 106 of the semiconductor chips 104 and with the surfaces of the electrical feedthroughs 130 which are situated opposite the adhesive foil 132. In an intermediate product that is not shown, a step can be formed between the frame 103 and the contact surfaces 106 and/or between the frame 103 and the surfaces of the electrical feedthroughs 130 which are situated opposite the adhesive foil. The contact surfaces 106 of the semiconductor chips 104 and those surfaces of the electrical feedthroughs which are situated opposite the adhesive foil 132 are completely freed of potting compound 102. The intermediate product 310 arises independently of whether method step S2 was performed in accordance with the variant S2A or the variant S2B.

In step S3, a first contact structure 114 is applied to that surface of the frame 103 which is situated opposite the adhesive foil 132, to the contact surfaces 106 of the semiconductor chips 104 and to those surfaces of the electrical feedthroughs 130 which are situated opposite the adhesive foil 132. The first contact structure 114 can be applied by photolithography, screen printing or jetting, for example. The contact structure 114 comprises, for example, a metal, such as copper, or a metallic alloy. FIG. 11 shows the intermediate product 312 after step S3 has been performed, in sectional view. The first contact structure 114 in each case connects the contact surface 106 of a semiconductor chip 104 to an electrical feedthrough 130.

Figure 12:
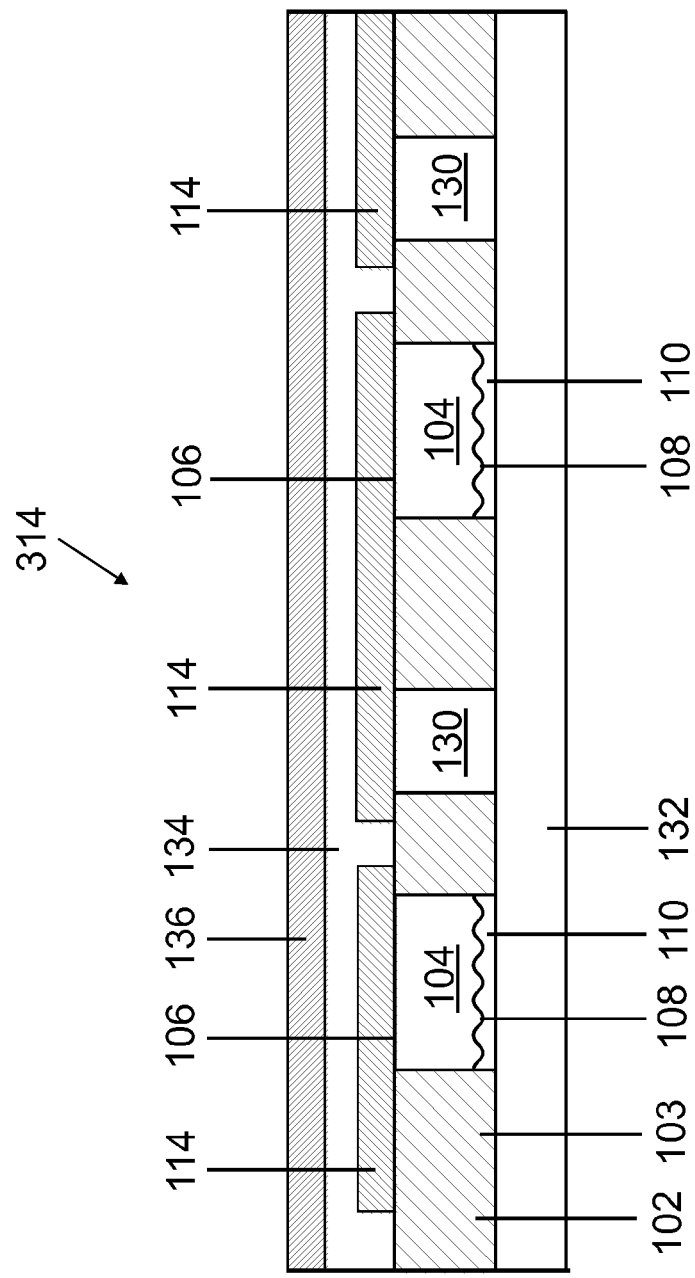
FIG. 12 shows the intermediate product after performing optional step S4 of the production method in sectional view.

In optional step S4, an electrically insulating, in particular dielectric, layer 134 is applied to the first contact structure 114 and to the regions—not covered by the first contact structure 114—of the side of the frame 103 composed of potting compound 102 which is situated opposite the adhesive foil 132. A, more particularly metallic, heat sink 136 is subsequently applied to the electrically insulating layer 134. FIG. 12 shows the intermediate product 314 after optional step S4 has been performed.

FIGS. 8, 9, 10, 11 and 12 illustrate only semiconductor chips 104 which have a transparent contact layer 110 as contact on the emission surface 108. However, the production method proceeds identically if, instead of the transparent contact layer 110, a contact pad 117 is applied as contact on the emission surface 108.

Figure 13:
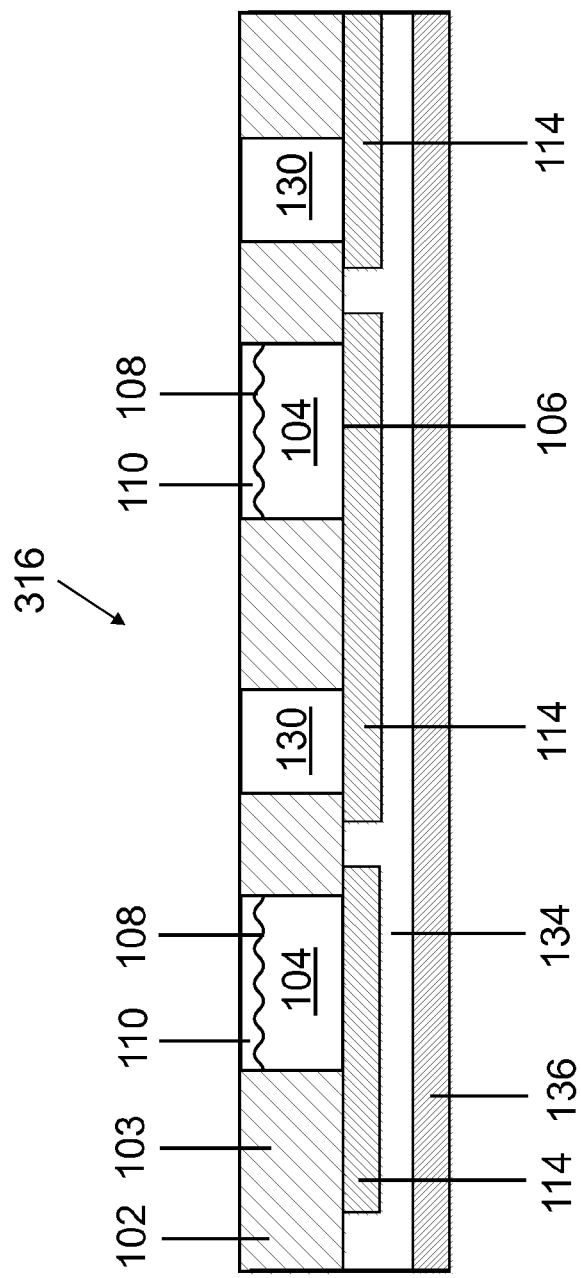
FIG. 13 shows the intermediate product after performing step S5 of the production method in sectional view.
Figure 14:
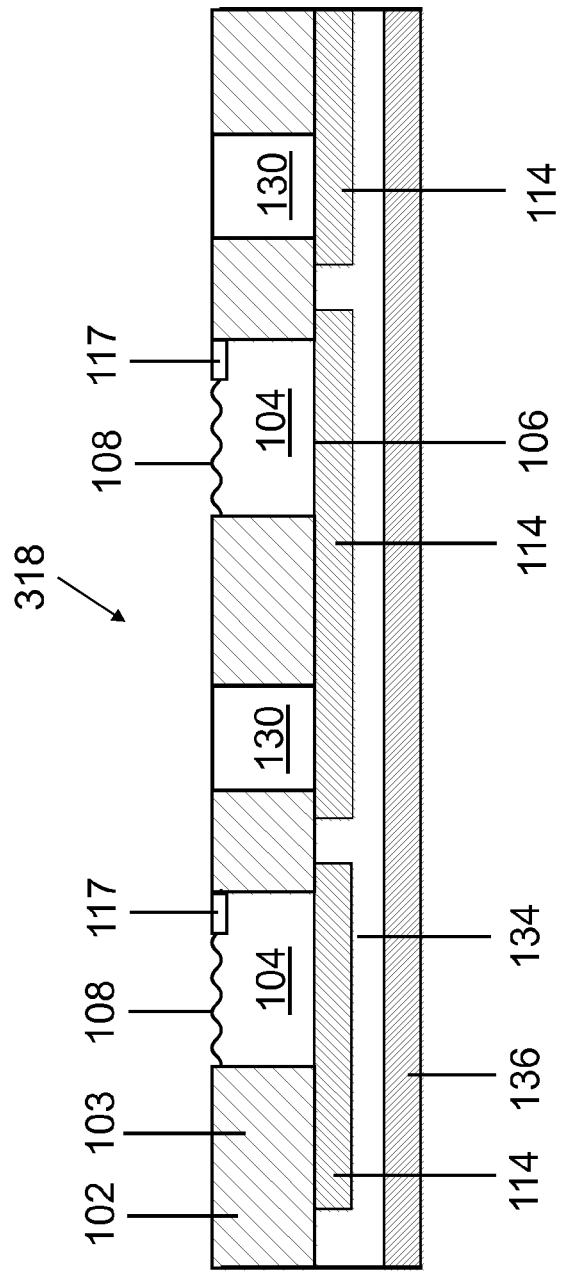
FIG. 14 shows the alternative intermediate product after performing step S5 of the production method in sectional view.

In step S5, the adhesive foil 132 is removed. By way of example, the adhesive foil 132 can be removed by simply being pulled off. FIG. 13 and FIG. 14 show the intermediate product 316 and 318 after step S5 has been performed, in sectional view. FIG. 13 illustrates semiconductor chips 104 whose emission surface 108 is completely covered with the transparent contact layer 110. The transparent contact layer 110 is completely freed of potting compound 102. FIG. 14 illustrates semiconductor chips 104 in which the contact pad 117 is applied directly to the emission surface 108. The contact pad 117 and the emission surface 108 are completely freed of potting compound 102. Moreover, FIGS. 13 and 14 show electrical feedthroughs 130 whose surfaces situated opposite the first contact structure 114 are completely freed of potting compound 102. As a result, the semiconductor chips 104 and the electrical feedthroughs 130 are designed for the application of a second contact structure 116.

In step S6, a second contact structure 116, 138 is applied to the frame 103 composed of potting compound 102, to the contacts 110, 117 on the emission surface 108 for the purpose of making electrical contact with a layer having a second conductivity (not shown in 15a) of the semiconductor chips 104 and to the electrical feedthroughs 130. The second contact structure 116 can comprise, for example, a metal, such as copper, or a metallic alloy. The second contact structure 116 can be applied, for example, by photolithography, screen printing or jetting.

Figure 15A:
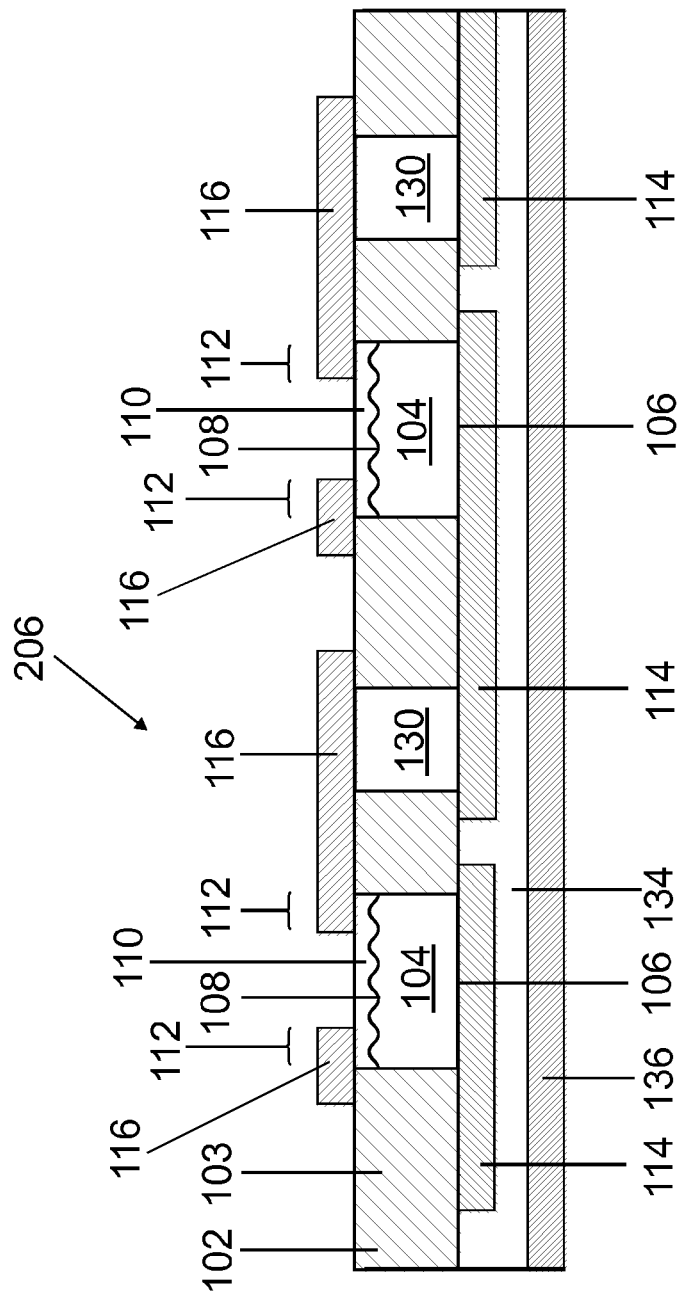
FIG. 15a shows a third exemplary embodiment of an optoelectronic module according to the invention in sectional view after performing step S6 of the production method.
Figure 15B:
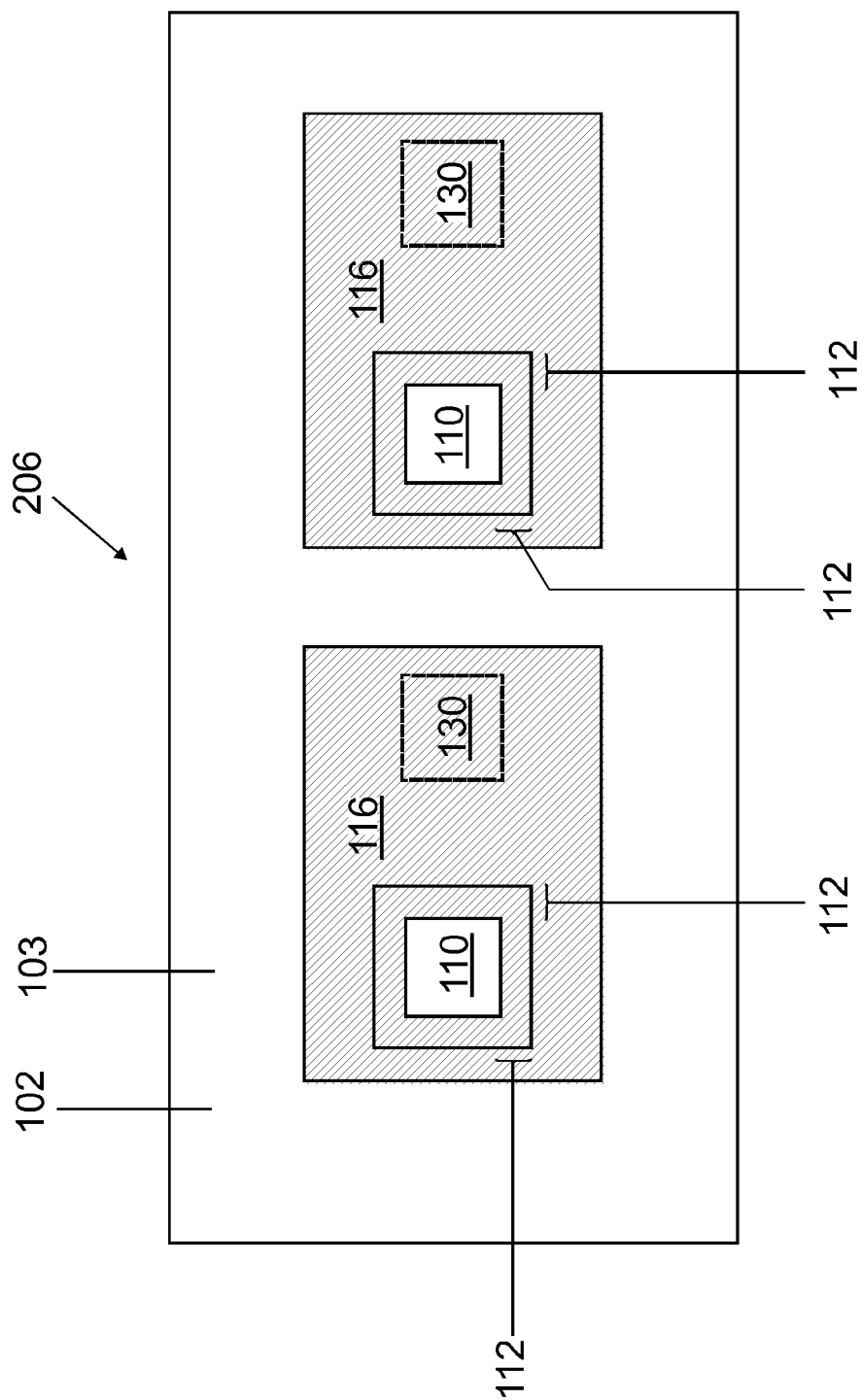
FIG. 15b shows the optoelectronic module according to the invention from FIG. 15a in plan view.

The end product 206 after step S6 has been performed is shown in FIGS. 15a and 15b. FIG. 15a shows a third exemplary embodiment of an optoelectronic module 206 according to the invention in sectional view. FIG. 15b shows the optoelectronic module 206 according to the invention from FIG. 15a in plan view. The optoelectronic module 206 comprises two semiconductor chips 104 each with a transparent contact layer 110. The electrical feedthroughs 130 in each case electrically conductively connect the first contact structure 114 of a first semiconductor chip 104 to the second contact structure 116 of an adjacent semiconductor chip 104. The second contact structure 116 is in electrical contact with the transparent contact layer 110 and energizes the latter from all four sides (see FIG. 15b). The second contact layer 116 is applied to the frame 103 in a planar fashion and has an overlap region 112 with the transparent contact layer 110 of 5 µm, for example. The two semiconductor chips 104 are interconnected in series with one another. The electrical feedthroughs 130 are absolutely necessary for this purpose. An electrically insulating insulation layer 134 is applied on that side of the frame 103 which adjoins the contact surface 106. A, more particularly metallic, heat sink 136 is applied on the insulation layer 134.

The optoelectronic module 208 that is an alternative to the optoelectronic module 206, as the end product of step S6, is shown in FIGS. 16a and 16b. FIG. 16a shows a fourth exemplary embodiment of an optoelectronic module 208 according to the invention in sectional view. FIG. 16b shows the optoelectronic module 208 according to the invention from FIG. 16a in plan view. The first contact structure 114, the arrangement of the insulation layer 134 and of the heat sink 136 of the optoelectronic module 208 are identical to the optoelectronic module 206. The two semiconductor chips 104 in FIGS. 16a and 16b are interconnected in series. The second contact structure is embodied as a planar contact layer 138, which electrically conductively connects the electrical feedthroughs 130 to the contacts pads 117 on the emission surfaces 108 of the two semiconductor chips 104. The properties and dimensions of the planar contact structure 138 and of the contact pad 117 are described, for example, in FIGS. 4a and 4b.

Figure 17:
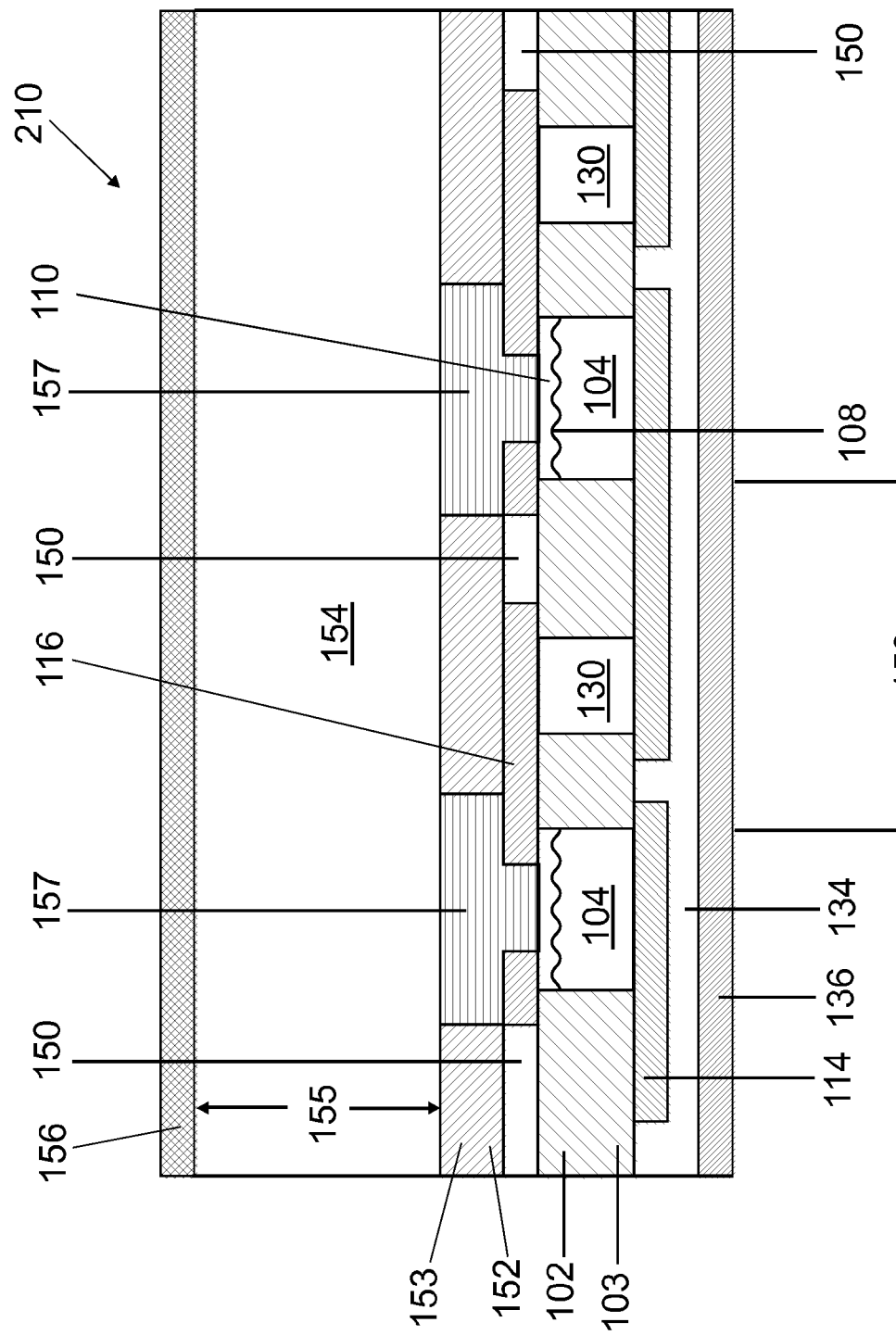
FIG. 17 shows a fifth exemplary embodiment of an optoelectronic module according to the invention in sectional view after performing optional step S7 of the production method.

In optional step S7, a mixing element 154 is placed onto the arrangement illustrated in FIG. 15a. The mixing element serves for spatially and spectrally intermixing the electromagnetic radiation 118 emitted by the semiconductor chips 104. FIG. 17 shows a fifth exemplary embodiment of an optoelectronic module 210 according to the invention in sectional view after optional step S7 of the production method has been performed. The heat sink 136, the electrically insulating layer 134, the first contact structure 114, the frame 103, the two semiconductor chips 104 with the associated emission surfaces 108 and the transparent contact layers 110 applied on the emission surfaces 108 and also the second contact structure 116 are identical to the exemplary embodiment in FIG. 15a. As in the exemplary embodiment from FIG. 15a, the semiconductor chips 104 are interconnected in series with one another. In contrast to the optoelectronic module 206 in FIGS. 15a and 15b, a mixing element 154 is provided in the case of the optoelectronic module 210. The mixing element 154 is disposed downstream of the semiconductor chips 104 in the emission direction. The thickness 155 of the mixing element 154 substantially corresponds to the distance 159 between adjacent semiconductor chips 104. The thickness 155 can have, for example, values of between 1 mm and 10 mm, preferably between 3 mm and 6 mm, particularly preferably 4 mm. The mixing element 154 can comprise glass ($SiO_2$) or polymethyl methacrylate (PMMA), for example.

By way of example, a coupling-out layer 156 can be arranged on that surface of the mixing element 154 which faces away from the frame 103. The coupling-out layer 156 can be realized as a roughening of the surface of the mixing element 154. The coupling-out layer 156 is advantageous since more light can leave the mixing element 154. The roughening of the mixing element 154 can be produced during the production of the mixing element 154 or subsequently. The roughening can comprise a pyramid structure, for example. The pyramids can be produced, for example, by means of a sputtering process in the surface of the mixing element 154. The size of the coupling-out structures are in the range of one or more wavelengths of the light emitted by the semiconductor chips 104, for example, between 50 nm and 5 µm, in particular between 100 nm and 1 µm. The following elements are arranged between the unit comprising frame 103, semiconductor chips 104 and electrical feedthroughs 130 and the mixing element 154. Transparent refractive index matching elements 157, in particular composed of silicone, are provided on the emission surfaces 108, more precisely on the transparent contact layers 110. The value of the refractive index of the transparent refractive index matching elements 157 is between the value of the refractive index of the semiconductor chips 104 and the value of the refractive index of the mixing element 154. The refractive index of glass for light in the visible spectral range is approximately 1.4. The refractive index of PMMA is approximately 1.49. The refractive index for an InGaN semiconductor chip is approximately 2.4. The refractive index for an InGaAlP semiconductor chip is approximately 3.5. High refractive index HRI silicone, having a refractive index of approximately 1.6, is preferably used for the refractive index matching elements 157.

A structured mirror layer 152 or alternatively a structured scattering layer 153 is disposed downstream of the frame 103. The structured mirror layer 152 can be, for example, a metallic mirror layer, in particular composed of silver. The structured scattering layer 153 can comprise silicone, for example, into which scattering particles (not shown in FIG. 17) are dispersed.

The structured mirror layer 152 or scattering layer 153 is connected to the frame 103 by means of a connecting medium 150, for example. The connecting medium 150 can be silicone adhesive, for example. The connecting medium 150 and the refractive index matching element 157 can, for example, consist of the same material and be produced simultaneously in the same process.

A transparent refractive index matching element 157 fills the entire cavity formed by the planar surface of the transparent contact layer 110, the second contact structure 116, the structured scattering layer 153 or the structured mirror layer 152 and the mixing element 154.

Figure 18:
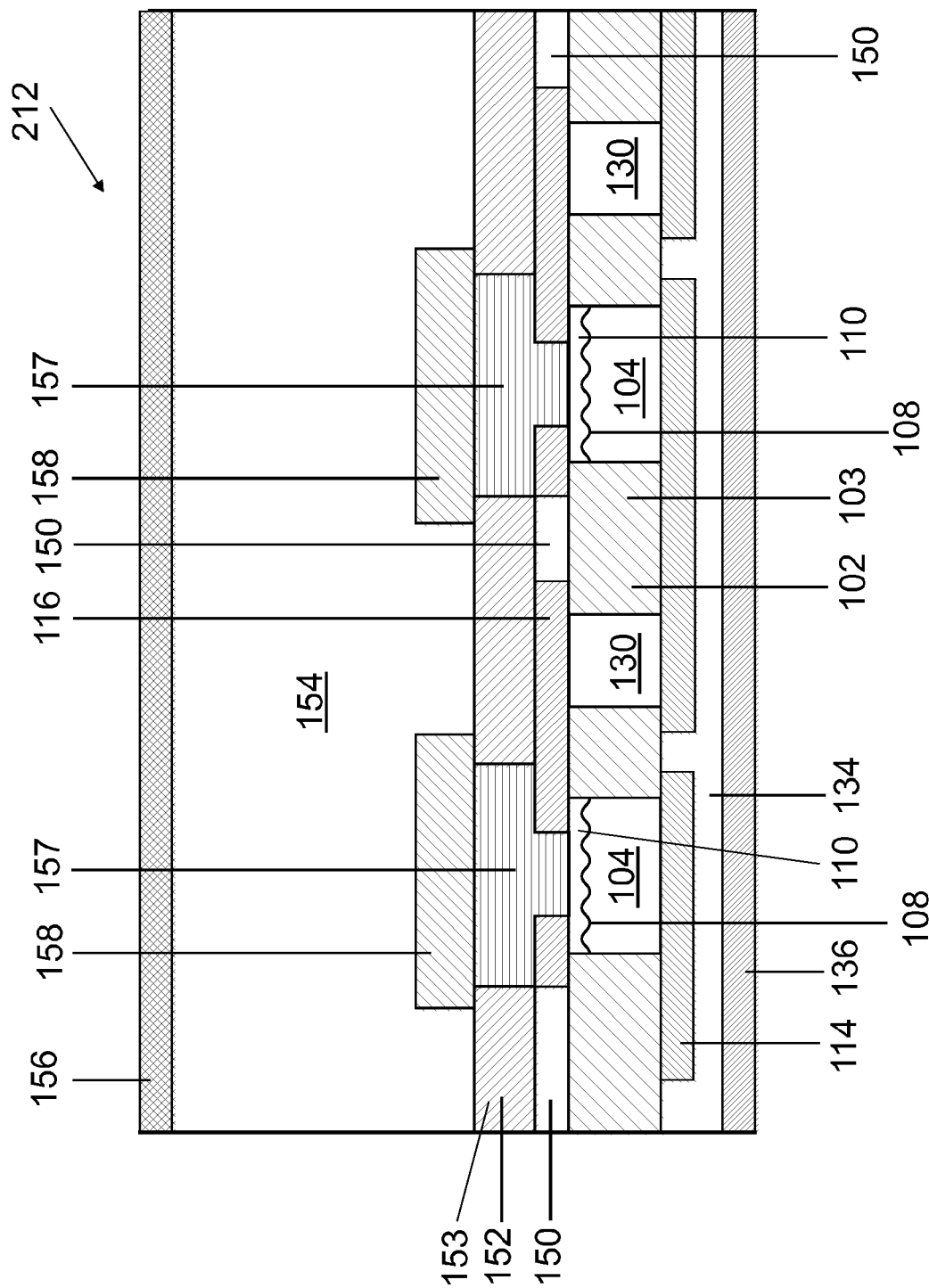
FIG. 18 shows a sixth exemplary embodiment of an optoelectronic module according to the invention in sectional view after performing optional step S7 of the production method.

FIG. 18 shows a sixth exemplary embodiment of an optoelectronic module 212 according to the invention in sectional view after optional step S7 of the production method has been performed. The optoelectronic module 212 differs from the optoelectronic module 210 from FIG. 17 only in that conversion elements 158 are introduced into the mixing element 154. The conversion elements 158 are disposed downstream of the transparent refractive index matching elements 157 and the semiconductor chips 104 in the emission direction. The conversion elements 158 can comprise silicone, for example, into which phosphor particles, for example, composed of yttrium aluminum granate (YAG), are embedded. The cavities in the mixing element that receive the conversion elements 158 can be produced by impression of a master or by hot embossing.

Figure 19:
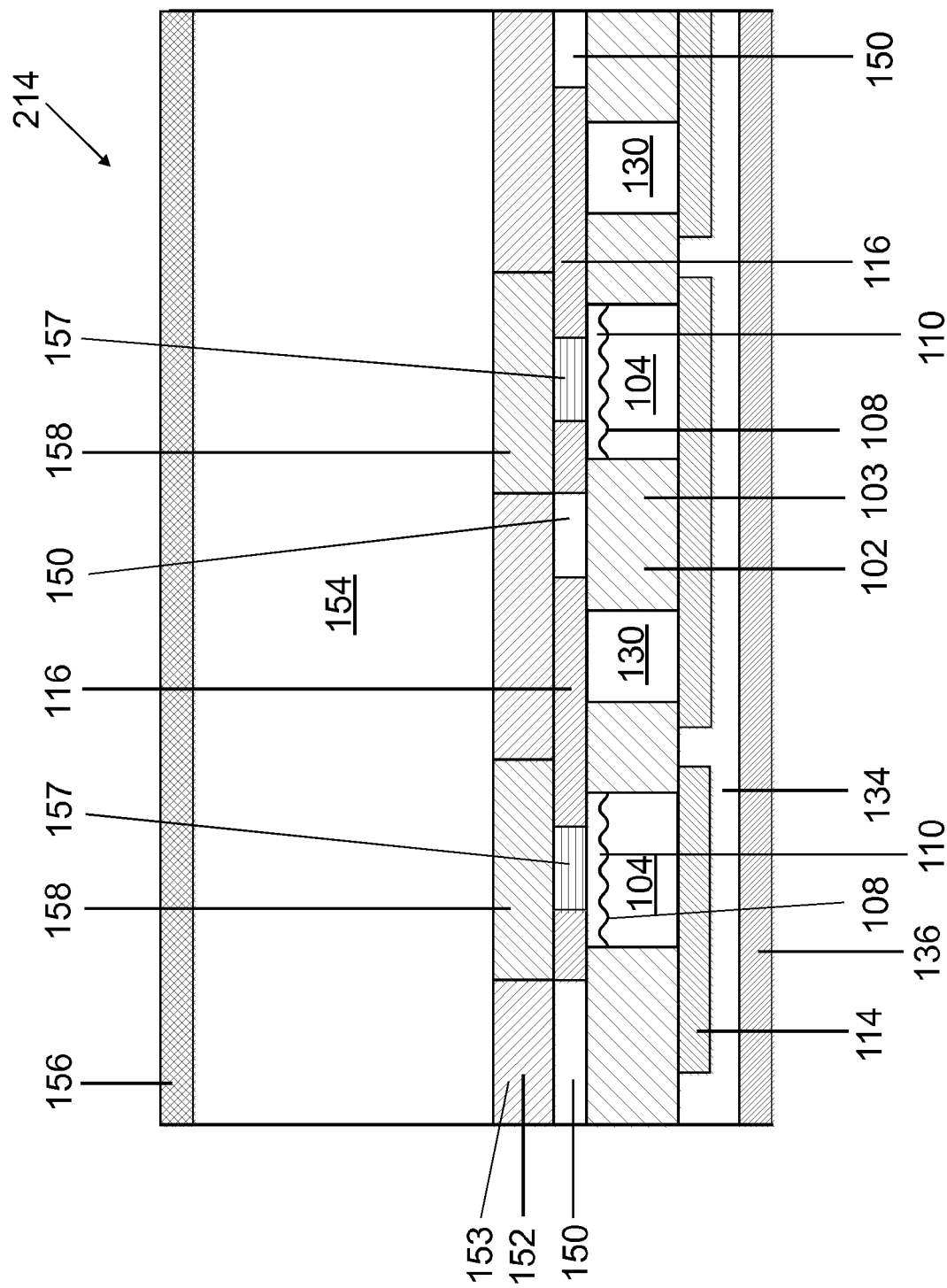
FIG. 19 shows a seventh exemplary embodiment of an optoelectronic module according to the invention in sectional view after performing optional step S7 of the production method.

FIG. 19 shows a seventh exemplary embodiment of an optoelectronic module 214 according to the invention in sectional view after optional step S7 of the production method has been performed. The optoelectronic module 214 substantially corresponds to the optoelectronic module 212. Just the conversion elements 158 are arranged differently. The conversion elements 158 are arranged in the cutouts of the structured mirror layer 152 or of the structured scattering layer 153. In other words, the conversion elements 158 fill a large portion of the cavity defined in the text concerning FIG. 18. In other words, the conversion elements 158 are arranged between the mixing element 154 and the refractive index matching elements 157.

Figure 20:
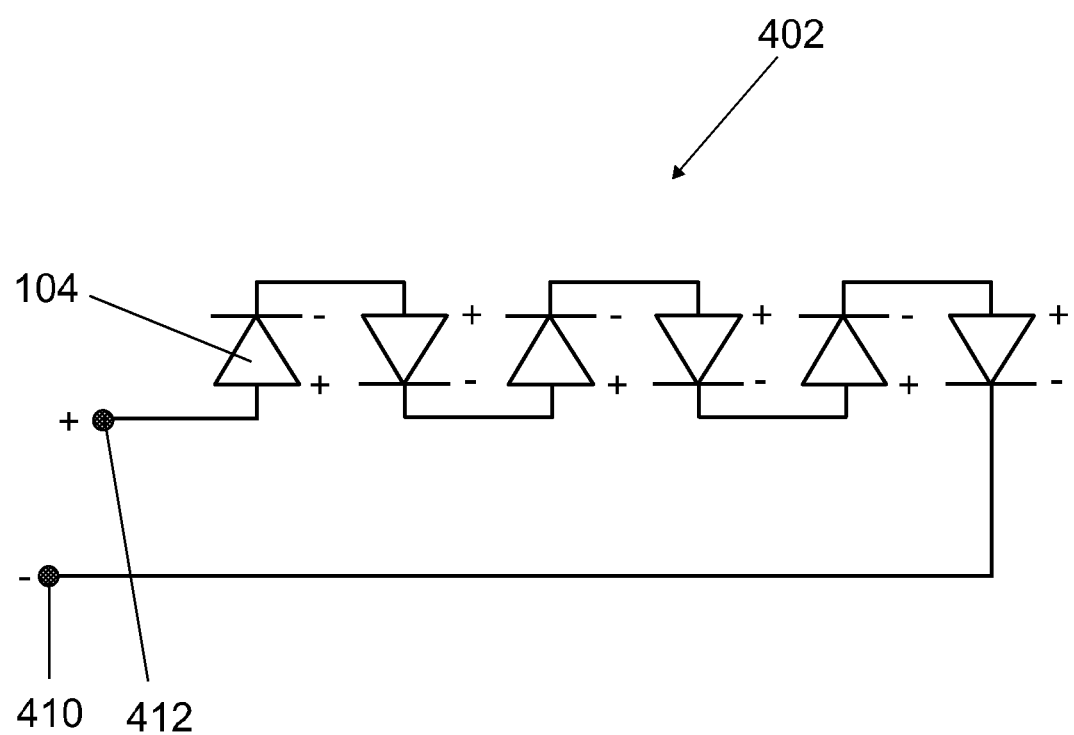
FIG. 20 shows an equivalent circuit diagram for semiconductor chips interconnected in series.
Figure 21:
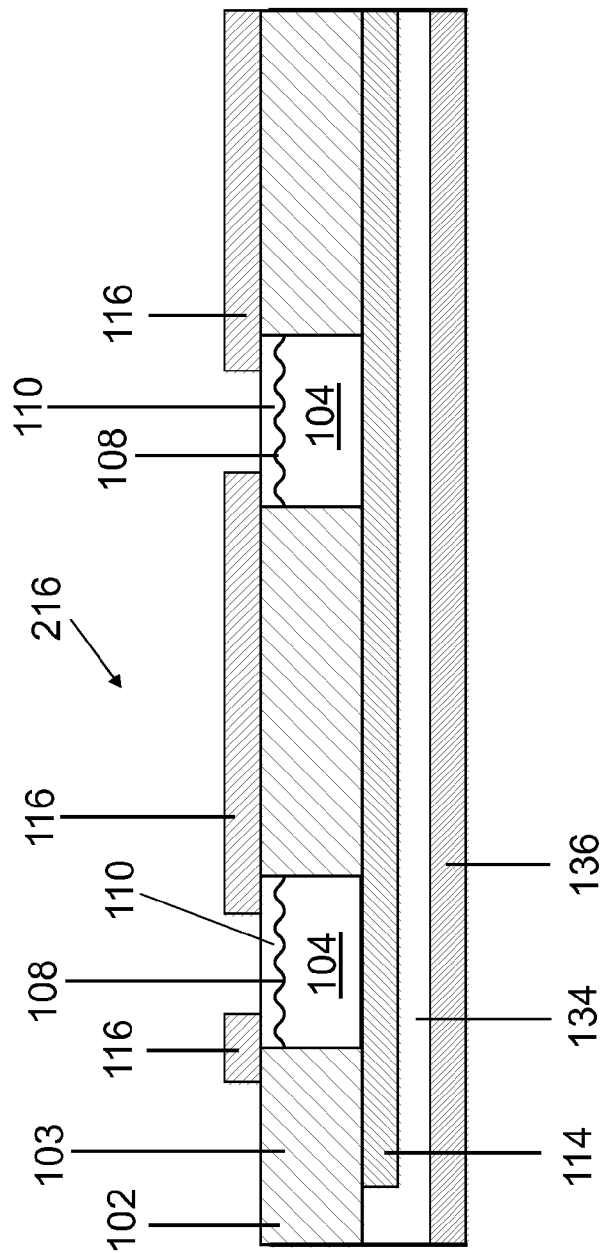
FIG. 21 shows an eighth exemplary embodiment of an optoelectronic module according to the invention in sectional view after performing step S6 of the production method.

FIG. 20 shows an equivalent circuit diagram 402 for, for example, five semiconductor chips 104 interconnected in series. The semiconductor chips 104 are energized by a first 410 and a second 412 external terminal. FIG. 21 shows an eighth exemplary embodiment of an optoelectronic module 216 according to the invention in sectional view after step S6 of the production method has been performed. The two semiconductor chips 104 are interconnected in parallel with one another via a first contact structure 114 and a second contact structure 116. Transparent contact layers 110 are illustrated by way of example as contacts on the emission surface 108. In an exemplary embodiment that is not shown, metallic contact pads 117 can be used as contacts on the emission surface 108 with the same function. No electrical feedthroughs 130 are required. Optionally, in a step S7, a mixing element 154 can be disposed downstream of the semiconductor chips 104 in the emission direction. Such an optoelectronic module comprising semiconductor chips 104 interconnected in parallel is not illustrated in the figures since, apart from the parallel interconnection of the semiconductor chips 104, the statements made in respect of optoelectronic modules (for example, FIGS. 17, 18 and 19) comprising semiconductor chips 104 interconnected in series hold true.

Figure 22:
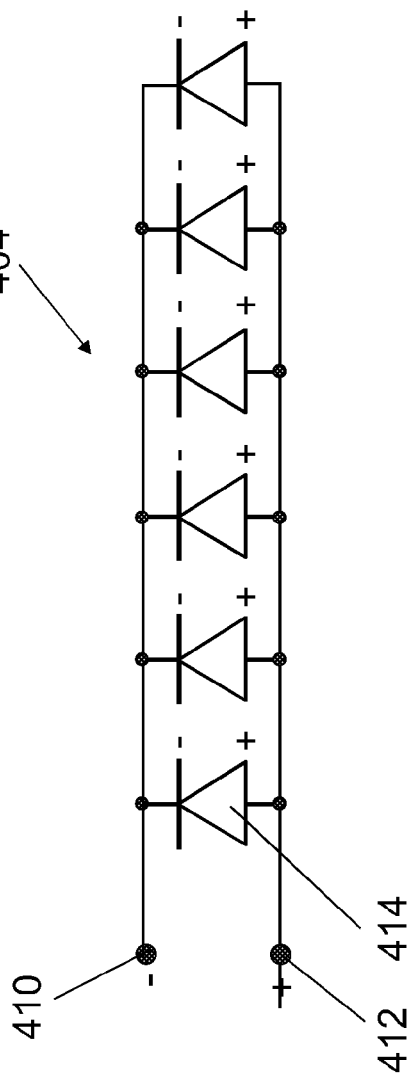
FIG. 22 shows an equivalent circuit diagram for semiconductor chips interconnected in parallel.

FIG. 22 shows an equivalent circuit diagram 404 for, for example, five semiconductor chips 104 interconnected in parallel. The semiconductor chips are energized by a first 410 and a second 412 external terminal.

In the optoelectronic modules 210, 212, 214 and 216, the semiconductor chips 104 are in each case contact-connected via a transparent contact layer 110 on the emission surface 108. Alternatively, the semiconductor chips 104 can be contact-connected via a contact pad 117 on the emission surface 108. Since optoelectronic modules comprising semiconductor chips 104 with a contact pad 117 correspond for the rest to the optoelectronic modules comprising a transparent contact layer 110, further exemplary embodiments comprising semiconductor chips 104 with a contact pad 117 have been omitted.

Figure 23A:
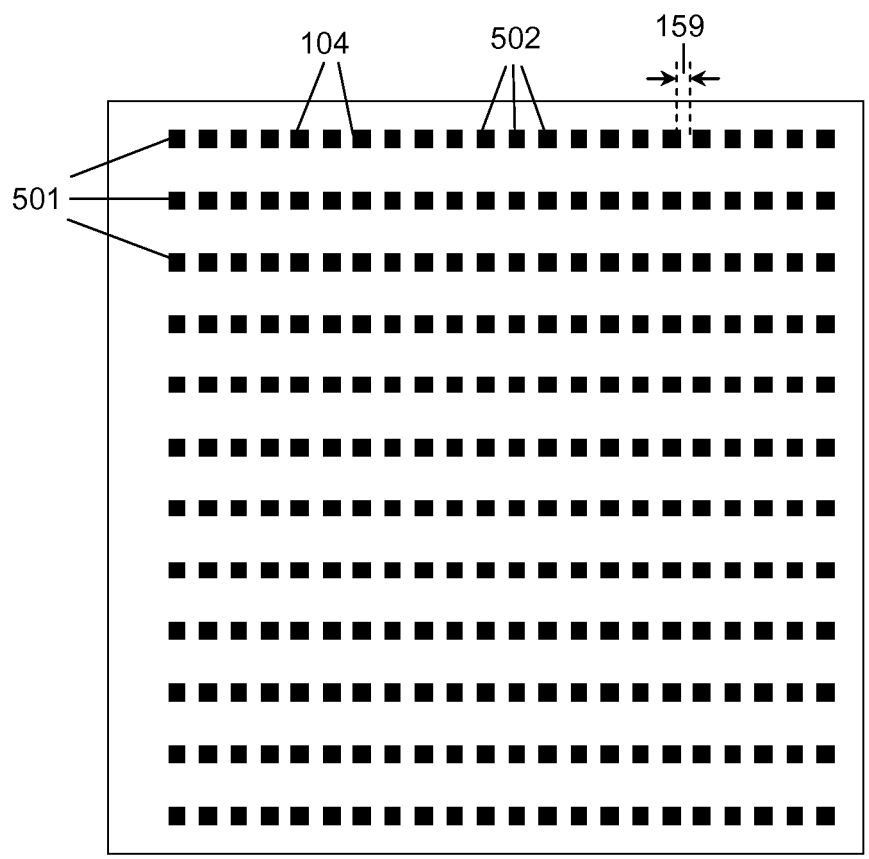
FIGS. 23A, 23B, 23C show further method steps of a method described here on the basis of schematic plan views.
Figure 23B:
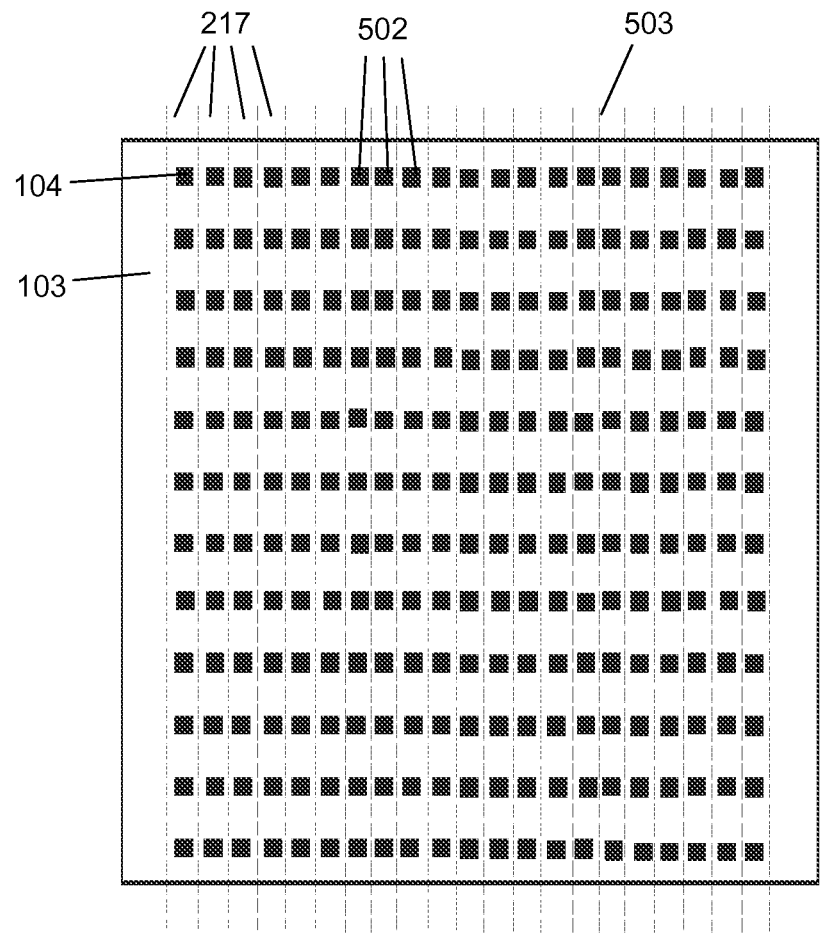
Figure 23C:
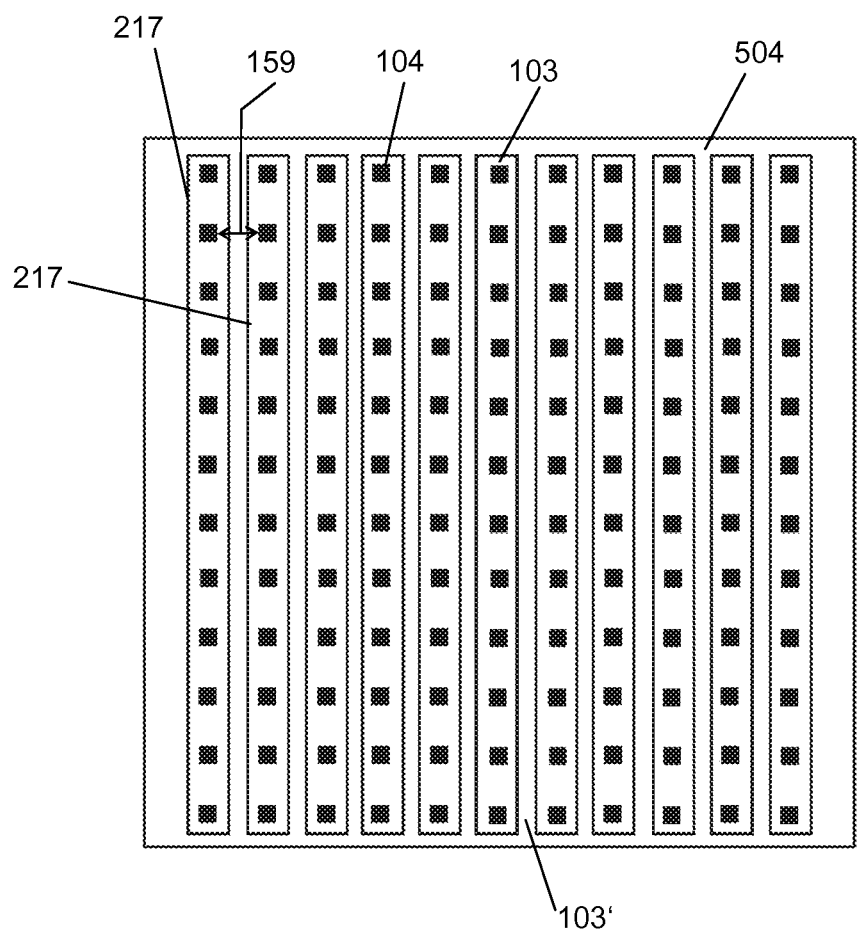

FIGS. 23a, 23b, 23c show further method steps of a method described here on the basis of schematic plan views.

The schematic plan view in FIG. 23a schematically illustrates an optoelectronic module described here in which a multiplicity of semiconductor chips 104 are arranged in rows 501 and column 502 on the adhesive foil and encapsulated by the frame 103. Furthermore, the semiconductor chips 104 have at least already been wired, that is to say that the first and/or the second contact structures 114, 116, 138 have already been applied. In this case, the contact structures are not illustrated in FIG. 23a for the sake of better clarity.

In a subsequent method step, FIG. 23b, the arrangement comprising semiconductor chips 104 and frame 103 is severed, in the present case between the columns 502. This gives rise to modules 217 of reduced size, which in the present case are linear modules, see FIG. 23c.

The modules 217 of reduced size are arranged on an auxiliary carrier 504, for example, a further adhesive foil. In this case, the distance 159 between directly adjacent semiconductor chips 104 with their epitaxial layer sequences assigned to different directly adjacent modules 217 of reduced size is increased in comparison with the distance 159 between directly adjacent semiconductor chips prior to severing.

In a next method step, the individual modules 217 of reduced size can be connected again to form a larger optoelectronic module, for example, by potting compound for forming a further frame 103' being introduced between the modules 217 of reduced size.

In this way, an optoelectronic module arises in which the occupation density with optoelectronic semiconductor chips is reduced.

The optoelectronic module and the method for producing an optoelectronic module have been described on the basis of some exemplary embodiments in order to elucidate the underlying concept. In this case, the exemplary embodiments are not restricted to specific combinations of features. Even if some features and configurations have been described only in association with one particular exemplary embodiment or individual exemplary embodiments, they can be combined in each case with other features from other exemplary embodiments. It is likewise possible, in exemplary embodiments, to omit or add individual illustrated features or particular configurations, insofar as the general technical teaching remains realized.

Even if the steps of the method for producing an optoelectronic module are described in a specific order, it goes without saying that each of the methods described in this disclosure can be carried out in any other expedient order, wherein method steps can also be omitted or added, insofar as there is no departure from the basic concept of the technical teaching described.

The invention claimed is:

1. An optoelectronic module comprising:
    a semiconductor chip for emitting electromagnetic radiation, the semiconductor chip having a layer having a first conductivity, a layer having a second conductivity, an emission surface and a contact surface situated opposite the emission surface;
    a contact on the emission surface;
    a frame composed of potting compound, the frame enclosing the semiconductor chip laterally at least regionally in such a way that the emission surface and the contact surface are substantially free of potting compound;
    a first contact structure, at least regionally arranged on the frame and at least regionally arranged on the contact surface, in electrical contact with the layer having the first conductivity;
    a second contact structure, at least regionally arranged on the frame and at least regionally arranged on the contact of the emission surface, in electrical contact with the layer having the second conductivity;
    a mixing element to spatially intermix electromagnetic radiation, wherein the mixing element is disposed downstream of the semiconductor chip in an emission direction; and
    a structured mirror layer or a structured scattering layer arranged at least regionally between the frame and the mixing element.

2. The optoelectronic module according to claim 1, wherein:
    the contact on the emission surface has a transparent contact layer, wherein the transparent contact layer covers the emission surface over the whole area;
    the emission surface is free of metallic contact structures and free of a contact pad; and
    the transparent contact layer is in direct contact with the contact structure.

3. The optoelectronic module according to claim 1, wherein the first contact structure is applied on a side of the frame that adjoins the contact surface and wherein the second contact structure is applied on a side of the frame that adjoins the emission surface.

4. The optoelectronic module according to claim 1, wherein an electrically insulating insulation layer is applied on a side of the frame that adjoins the contact surface and on the contact surface and a heat sink is applied on the insulation layer.

5. The optoelectronic module according to claim 1, further comprising a transparent refractive index matching element between the emission surface and the mixing element, wherein the refractive index of the transparent refractive index matching element is between the refractive index of the semiconductor chip and the refractive index of the mixing element.

6. The optoelectronic module according to claim 1, further comprising a second semiconductor chip adjacent to the semiconductor chip.

7. The optoelectronic module according to claim 6, wherein the semiconductor chip and the second semiconductor chip are interconnected in series and/or in parallel with one another.

8. The optoelectronic module according to claim 6, wherein a thickness of the mixing element substantially corresponds to a distance between adjacent semiconductor chips.

9. The optoelectronic module according to claim 6, comprising an electrical feedthrough in the frame, wherein the electrical feedthrough electrically conductively connects the first contact structure of the semiconductor chip to a second contact structure of the second semiconductor chip.

10. The optoelectronic module according to claim 1, wherein the mixing element has, at an underside facing the semiconductor chip, a cavity filled with a conversion element, wherein the cavity is disposed downstream of the semiconductor chip in the emission direction.

11. An optoelectronic module comprising:
a semiconductor chip for emitting electromagnetic radiation, the semiconductor chip having a layer having a first conductivity, a layer having a second conductivity, an emission surface and a contact surface situated opposite the emission surface;
a contact on the emission surface;
a frame composed of potting compound, the frame enclosing the semiconductor chip laterally at least regionally in such a way that the emission surface and the contact surface are substantially free of potting compound;
a first contact structure, at least regionally arranged on the frame and at least regionally arranged on the contact surface, in electrical contact with the layer having the first conductivity;
a second contact structure, at least regionally arranged on the frame and at least regionally arranged on the contact of the emission surface, in electrical contact with the layer having the second conductivity;
an electrically insulating insulation layer disposed on a side of the frame that adjoins the contact surface and on the contact surface; and
a metallic heat sink overlying the insulation layer.

12. The optoelectronic module according to claim 11, further comprising a mixing element for spatially intermixing electromagnetic radiation, wherein the mixing element is disposed downstream of the semiconductor chip in an emission direction.

13. The optoelectronic module according to claim 12, further comprising a structured mirror layer or a structured scattering layer at least regionally between the frame and the mixing element.

* * * * *